(12) United States Patent
Ahn et al.

(10) Patent No.: US 12,031,070 B2
(45) Date of Patent: *Jul. 9, 2024

(54) QUANTUM WELL NANOCRYSTALS WITH QUATERNARY ALLOY STRUCTURE FOR IMPROVED LIGHT ABSORPTION

(71) Applicant: Samsung Display Co., Ltd., Yongin-si (KR)

(72) Inventors: Jooyeon Ahn, Suwon-si (KR); Hyeyeon Yang, Suwon-si (KR); Tae Gon Kim, Hwaseong-si (KR); Jongmin Lee, Hwaseong-si (KR); Shin Ae Jun, Seongnam-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 656 days.

This patent is subject to a terminal disclaimer.

(21) Appl. No.: 17/199,613

(22) Filed: Mar. 12, 2021

(65) Prior Publication Data
US 2021/0284907 A1 Sep. 16, 2021

(30) Foreign Application Priority Data
Mar. 13, 2020 (KR) .......................... 10-2020-0031618

(51) Int. Cl.
*H01L 35/24* (2006.01)
*C08J 5/18* (2006.01)
(Continued)

(52) U.S. Cl.
CPC ............... *C09K 11/565* (2013.01); *C08J 5/18* (2013.01); *C09K 11/06* (2013.01); *C09K 11/54* (2013.01);
(Continued)

(58) Field of Classification Search
CPC ....... C09K 11/565; C09K 11/06; C09K 11/54; C09K 11/62; C09K 11/883; C08J 5/18;
(Continued)

(56) References Cited

U.S. PATENT DOCUMENTS 7,819,539 B2  10/2010  Kim et al.
7,867,557 B2  1/2011  Pickett et al.
(Continued)

FOREIGN PATENT DOCUMENTS

CN   204102922 U   1/2015
CN   105405941 A   3/2016
(Continued)

OTHER PUBLICATIONS

E M Kazaryan et al., "Impurity states in ZnS/InP/ZnSe core/shell/shell spherical quantum dot," Journal of Physics: Conference Series, 2012, pp. 1-5, vol. 350.
(Continued)

*Primary Examiner* — Theresa T Doan
(74) *Attorney, Agent, or Firm* — CANTOR COLBURN LLP

(57) ABSTRACT

A quantum dot, and a quantum dot composite and a device including the same are disclosed, wherein the quantum dot includes a template including a first semiconductor nanocrystal, a quantum well (e.g., quantum well layer) disposed on the template and a shell disposed on the quantum well, the shell including a second semiconductor nanocrystal, and wherein the quantum dot does not include cadmium, wherein the first semiconductor nanocrystal includes a first zinc chalcogenide, wherein the second semiconductor nanocrystal includes a second zinc chalcogenide, and the quantum well layer includes an alloy semiconductor nanocrystal including indium (In), phosphorus (P), zinc (Zn), and a chalcogen element wherein a bandgap energy of the alloy
(Continued)

semiconductor nanocrystal is less than a bandgap energy of the first semiconductor nanocrystal and less than a bandgap energy of the second semiconductor nanocrystal.

30 Claims, 7 Drawing Sheets

(51) Int. Cl.
  *C09K 11/06* (2006.01)
  *C09K 11/54* (2006.01)
  *C09K 11/56* (2006.01)
  *C09K 11/62* (2006.01)
  *C09K 11/70* (2006.01)
  *H01L 51/00* (2006.01)
  *H10K 50/115* (2023.01)
  *B82Y 20/00* (2011.01)
  *B82Y 30/00* (2011.01)
  *B82Y 40/00* (2011.01)

(52) U.S. Cl.
  CPC ............. *C09K 11/62* (2013.01); *C09K 11/70* (2013.01); *H10K 50/115* (2023.02); *B82Y 20/00* (2013.01); *B82Y 30/00* (2013.01); *B82Y 40/00* (2013.01); *C08J 2300/12* (2013.01)

(58) Field of Classification Search
  CPC ...... H10K 50/115; B82Y 20/00; B82Y 30/00; B82Y 40/00
  USPC .......................................................... 257/40
  See application file for complete search history.

(56) References Cited

U.S. PATENT DOCUMENTS

| | | | |
|---|---|---|---|
| 8,963,119 B2 | 2/2015 | Jang et al. | |
| 9,834,724 B2 | 12/2017 | Kim et al. | |
| 10,197,820 B2 | 2/2019 | Youn et al. | |
| 10,424,695 B2 | 9/2019 | Won et al. | |
| 10,741,731 B2 | 8/2020 | Jang et al. | |
| 10,851,297 B2 | 12/2020 | Kim et al. | |
| 11,597,876 B2 * | 3/2023 | Yang ..................... | C09K 11/70 |
| 2008/0305334 A1 | 12/2008 | Jang et al. | |
| 2017/0052444 A1 | 2/2017 | Park et al. | |
| 2018/0094190 A1 | 4/2018 | Kim et al. | |
| 2019/0378959 A1 | 12/2019 | Won et al. | |

FOREIGN PATENT DOCUMENTS

| | | |
|---|---|---|
| CN | 107636111 A | 1/2018 |
| CN | 108239535 A | 7/2018 |
| CN | 109935722 A | 6/2019 |
| CN | 109971481 A | 7/2019 |
| CN | 110137363 A | 8/2019 |
| EP | 0229263 B1 | 3/1992 |
| JP | 2010106119 A | 5/2010 |
| KR | 0766027 B1 | 10/2007 |
| KR | 20080107578 A | 12/2008 |
| KR | 20110140049 A | 12/2011 |
| KR | 20140121217 A | 10/2014 |
| KR | 101525524 B1 | 6/2015 |
| KR | 1738551 B1 | 5/2017 |
| KR | 1739751 B1 | 5/2017 |
| KR | 20190032017 A | 3/2019 |
| KR | 101984990 B1 | 9/2019 |

OTHER PUBLICATIONS

Liang Li et al., "One-pot Synthesis of Highly Luminescent InP/ZnS Nanocrystals without Precursor Injection," Journal of the American Chemical Society, 2008, pp. 11588-11589, vol. 130.

M. J. Anc et al., "Progress in Non-Cd Quantum Dot Development for Lighting Applications," ECS Journal of Solid State Science and Technology, Nov. 28, 2012, pp. R3071-R3082, vol. 2.

Reginald B. Little et al., "Formation of quantum-dot quantum-well heteronanostructures with large lattice mismatch: ZnS/CdS/ZnS," The Journal of Chemical Physics, Jan. 22, 2001, pp. 1813-1822, vol. 114, No. 4.

* cited by examiner

Pattern Preparation by using a photoresist

Repeating the Patterning Process three times

QUANTUM WELL NANOCRYSTALS WITH QUATERNARY ALLOY STRUCTURE FOR IMPROVED LIGHT ABSORPTION

CROSS-REFERENCE TO RELATED APPLICATIONS

This application claims priority to and the benefit of Korean Patent Application No. 10-2020-0031618 filed in the Korean Intellectual Property Office on Mar. 13, 2020, and all the benefits accruing therefrom under 35 U.S.C. § 119, the content of which in its entirety is herein incorporated by reference.

BACKGROUND

1. Field

Quantum dots, a composition or a composite including the same, and a device including the same are disclosed.

2. Description of the Related Art

Unlike a bulk material, physical characteristics (e.g., bandgap energies and melting points) of a semiconductor nanoparticle may be controlled by changing the size of the nanoparticle. For example, a semiconductor nanocrystal particle (also known as a quantum dot) is a crystalline material having a size in a range of several nanometers. Because the semiconductor nanocrystal particle has a relatively small size, the nanocrystal particle has a large surface area per a unit volume, and thereby, the particle exhibits a quantum confinement effect and will have different properties than bulk materials of the same chemical composition. A quantum dot may absorb energy from an excitation source, e.g., light or an applied electric current, and upon relaxation to the ground state the quantum dot emits light energy corresponding to a bandgap energy of the quantum dot.

SUMMARY

An embodiment provides a quantum dot(s) and a composition including the same capable of exhibiting improved photoluminescence properties.

An embodiment provides a quantum dot composite including the quantum dot(s).

An embodiment provides a method of producing the quantum dot(s).

An embodiment provides an electronic device including the quantum dot.

In an embodiment, a quantum dot (or quantum dots) includes a template including a first semiconductor nanocrystal, a quantum well (e.g., a quantum well layer) disposed on the template and a shell disposed on the quantum well layer, the shell including a second semiconductor nanocrystal, and wherein the quantum dot does not include cadmium, wherein the first semiconductor nanocrystal includes a first zinc chalcogenide, wherein the second semiconductor nanocrystal includes a second zinc chalcogenide, and the quantum well layer includes an alloy semiconductor nanocrystal including indium (In), phosphorus (P), zinc (Zn), and a chalcogen element wherein a bandgap energy of the alloy semiconductor nanocrystal is less than a bandgap energy of the first semiconductor nanocrystal and less than an bandgap energy of the second semiconductor nanocrystal.

The first zinc chalcogenide may include ZnSe, ZnTeSe, ZnSeS, ZnS, or a combination thereof, and the second zinc chalcogenide may independent include ZnSe, ZnTeSe, ZnSeS, ZnS, or a combination thereof.

The first semiconductor nanocrystal and the second semiconductor nanocrystal may have different compositions from one another.

The first semiconductor nanocrystal and the second semiconductor nanocrystal may have the same composition with each other.

The quantum well layer may be (e.g., directly) adjacent to (e.g., on or in contact with) the template.

The quantum well layer may be (e.g., directly) adjacent to (e.g., on or in contact with) the shell.

The first semiconductor nanocrystal may include ZnSe, ZnTeSe, ZnSeS, ZnS, or a combination thereof.

The second semiconductor nanocrystal may include ZnSe, ZnSeS, ZnS, or a combination thereof.

The chalcogen element may include sulfur.

A difference between a lattice constant of the alloy semiconductor nanocrystal and the first semiconductor nanocrystal may be less than or equal to about 3%.

A difference between a lattice constant of the alloy semiconductor nanocrystal and the second semiconductor nanocrystal may be less than or equal to about 3%.

The quantum dot may have a total molar amount of indium and phosphorus of less than or equal to about 20%, based on a total number of moles of elements in the quantum dot (e.g., measured by an ICP analysis).

In the quantum dot, a mole ratio of phosphorus with respect to indium (P:In) may be greater than or equal to about 0.5:1 and less than or equal to about 0.9:1.

In the quantum dot, a mole ratio of sulfur with respect to indium (S:In) may be greater than or equal to about 5:1 and less than or equal to about 25:1.

In the quantum dot, a mole ratio of zinc with respect to indium (Zn:In) may be from about 15:1 to about 30:1, about 20:1 to about 55:1, or a combination thereof.

In the quantum dot, a mole ratio of a sum of sulfur and selenium with respect to zinc ((S+Se):Zn) may be greater than or equal to about 0.5:1 and less than or equal to about 1:1.

In the quantum dot, a mole ratio of sulfur with respect to selenium (S:Se) may be about greater than or equal to 0.3:1 and less than or equal to about 0.9:1.

The shell may include a first layer including a third zinc chalcogenide and a second layer including a fourth zinc chalcogenide that includes a different composition from the third zinc chalcogenide.

The first layer and the second layer may be (e.g., directly) on (e.g., in contact with) with each other.

The first layer may include ZnSe, ZnSeS, or a combination thereof.

The second layer may include ZnS.

The first layer may be (e.g., directly) adjacent to (or on or closer to) the quantum well layer and the second layer may be (e.g., included in) an outermost layer of the shell (e.g., an outermost layer of the quantum dot).

A thickness of the quantum well layer may be greater than or equal to about 0.1 nanometers (nm) (for example, greater than or equal to about 0.15 nm, greater than or equal to about 0.2 nm, or greater than or equal to about 0.22 nm) and less than or equal to about 1 nm (for example, less than or equal to about 0.8 nm, less than or equal to about 0.6 nm, or less than or equal to about 0.5 nm).

A thickness of the quantum well layer may be less than or equal to about 0.4 nm, or less than or equal to about 0.35 nm.

A size (an average size) of the quantum dot(s) may be less than or equal to about 6.5 nm, less than or equal to about 6 nm, less than or equal to about 5.5 nm, less than or equal to about 5 nm, less than or equal to about 4.5 nm, less than or equal to about 4 nm, or less than or equal to about 3.5 nm.

A size (an average size) of the quantum dot(s) may be greater than or equal to about 2 nm, greater than or equal to about 3 nm, greater than or equal to about 4 nm, or greater than or equal to about 5 nm.

The quantum dot may include an organic ligand on a surface thereof.

The organic ligand may include RCOOH, RCOOCOR, $RNH_2$, $R_2NH$, $R_3N$, RSH, $R_3PO$, $R_3P$, ROH, RCOOR', $RPO(OH)_2$, $R_2POOH$, or a combination thereof, wherein R and R' are independently a substituted or unsubstituted C1 to C30 aliphatic hydrocarbon, a substituted or unsubstituted C6 to C30 aromatic hydrocarbon, or a combination thereof.

An ultraviolet-visible (UV-Vis) absorption spectrum curve of the quantum dot may not have an inflection point within a wavelength range of about 400 nm to about 650 nm, or about 450 nm to about 620 nm (or less than or equal to about 580 nm or less than or equal to about 540 nm).

The quantum dot may emit green light.

The quantum dot (or the green light) may have, e.g., exhibit, a maximum luminescent peak wavelength in a range of greater than or equal to about 500 nm and/or less than or equal to about 540 nm.

A quantum efficiency (e.g., quantum yield) of the quantum dot may be greater than or equal to about 50%.

In an embodiment, a quantum dot composite (e.g., a quantum dot polymer composite) includes a matrix (e.g., a polymer matrix) and (e.g., a plurality of) the aforementioned quantum dot(s) dispersed in the (polymer) matrix.

The (polymer) matrix may be a linear polymer, a crosslinked polymer, or a combination thereof.

The crosslinked polymer may include a thiolene polymer, a crosslinked poly(meth)acrylate, a crosslinked polyurethane, a crosslinked epoxy resin, a crosslinked vinyl polymer, a crosslinked silicone resin, or a combination thereof.

The linear polymer may include a repeating unit having a carboxylic acid.

The linear polymer may include a unit derived from a monomer including a carbon-carbon double bond and a carboxylic acid group, a unit derived from a monomer having a dianhydride moiety, or a combination thereof.

The linear polymer may include:
a copolymer of a monomer combination including a first monomer including a carboxylic acid group and a carbon-carbon double bond, a second monomer including a carbon-carbon double bond and a hydrophobic moiety and not including a carboxylic acid group, and optionally a third monomer including a carbon-carbon double bond and a hydrophilic moiety and not including a carboxylic acid group;
a multiple aromatic ring-containing polymer having a backbone structure in which two aromatic rings are bound to a quaternary carbon atom that is a constituent atom of another cyclic moiety in the main chain and including a carboxylic acid group (—COOH); or
a combination thereof.

The quantum dot (polymer) composite may further include a metal oxide particulate (e.g., dispersed in the matrix), or a combination thereof.

The quantum dot (polymer) composite may have a form of a patterned film.

The quantum dot (polymer) composite may have, e.g., exhibit, an absorption rate of greater than or equal to about 90% for blue light (e.g., having a wavelength in the range of about 450 nm to about 470 nm).

In an embodiment, the quantum dot (polymer) composite may have a blue light conversion efficiency (CE %) or a blue light conversion rate (QE %) of greater than or equal to about 15%, greater than or equal to about 16%, greater than or equal to about 17%, greater than or equal to about 18%, or greater than or equal to about 19%.

In an embodiment, a display device includes a photoluminescence element and optionally a light source, wherein the photoluminescence element includes the aforementioned quantum dot composite, and the light source is configured to provide the photoluminescence element with incident light.

The incident light may include a light having a peak wavelength of about 440 nm to about 460 nm, or about 450 nm to about 455 nm.

The photoluminescence element may include a sheet of the quantum dot polymer composite.

The photoluminescence element may be a stacked structure including a substrate and a light emitting layer disposed on the substrate, wherein the light emitting layer includes a quantum dot composite pattern.

The pattern may include a, e.g., at least one, repeating section to emit light at a predetermined wavelength.

The repeating section may include a first repeating section that emits first light (e.g., red light).

The repeating section may include a second repeating section that emits second light (e.g., green light) having a different wavelength from the first light.

The repeating section may include a first section emitting red light and a second section emitting green light.

The pattern may include a first repeating section emitting first light and a second repeating section emitting a second light having a luminescent peak wavelength that is different from that of the first light.

In an embodiment, a quantum dot (or quantum dots) includes a template including a first semiconductor nanocrystal, a quantum well (e.g., quantum well layer) disposed on the template, and wherein the quantum dot does not include cadmium, wherein the first semiconductor nanocrystal includes a zinc chalcogenide, and the quantum well layer includes an alloy semiconductor nanocrystal including indium (In), phosphorus (P), zinc (Zn), and a chalcogen element, wherein a bandgap energy of the alloy semiconductor nanocrystal is less than a bandgap energy of the first semiconductor nanocrystal.

In the quantum dot, a mole ratio of sulfur with respect to indium may be greater than or equal to about 0.5:1, greater than or equal to about 0.6:1, greater than or equal to about 0.7:1, or greater than or equal to about 0.8:1. In the quantum dot, a mole ratio of sulfur with respect to indium may be less than or equal to about 1.5:1, less than or equal to about 1.3:1, or less than or equal to about 1:1.

In the quantum well layer, a mole ratio of a sum of indium and zinc with respect to a sum of phosphorus and sulfur ((In+Zn):(P+S)) may be greater than or equal to about 0.95:1 and less than or equal to about 1.6:1.

The first semiconductor nanocrystal may include a zinc selenide.

In the quantum dot, a mole ratio of phosphorus with respect to indium may be greater than or equal to about 0.5:1, greater than or equal to about 0.6:1, greater than or equal to about 0.7:1, or greater than or equal to about 0.8:1 and less than or equal to about 1.5:1, less than or equal to about 1.4:1, less than or equal to about 1.3:1, less than or equal to about 1.2:1, less than or equal to about 1.1:1, or less than or equal to about 1:1.

In an embodiment, a composition may include (e.g., a plurality of) the aforementioned quantum dot(s); a dispersing agent; a (photo)polymerizable monomer including a carbon-carbon unsaturated bond (e.g., a C=C double bond), a (thermal or photo) initiator; and a (organic) solvent (or a liquid vehicle).

The dispersing agent may include a carboxylic acid group containing compound (e.g., the aforementioned binder polymer or a monomer thereof).

The composition may further include a polythiol compound, a metal oxide fine particle, or a combination thereof.

The quantum dot(s) according to an embodiment may exhibit improved properties (e.g., improved luminescence efficiency together with enhanced blue light absorbance). The quantum dot of an embodiment may be used in various display devices and biological labeling (e.g., biosensors or bio-imaging), photodetectors, solar cells, hybrid composites, and the like.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

Figure 1:
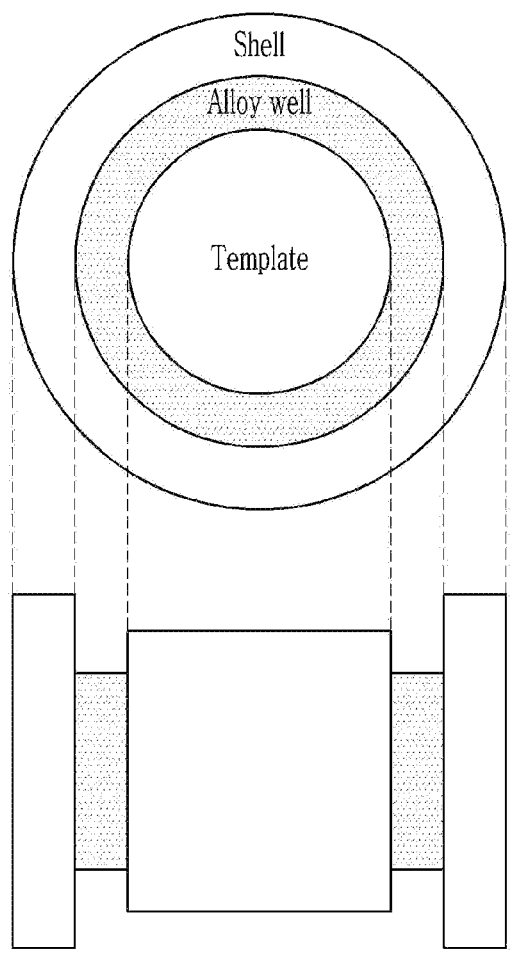
FIG. 1 is a schematic view showing a cross-section of a quantum dot according to an embodiment.

Advantages and characteristics of this disclosure, and a method for achieving the same, will become evident referring to the following example embodiments together with the drawings attached hereto. However, the embodiments should not be construed as being limited to the embodiments set forth herein. If not defined otherwise, all terms (including technical and scientific terms) in the specification may be defined as commonly understood by one skilled in the art. The terms defined in a generally-used dictionary may not be interpreted ideally or exaggeratedly unless clearly defined. In addition, unless explicitly described to the contrary, the word "comprise" and variations such as "comprises" or "comprising," will be understood to imply the inclusion of stated elements but not the exclusion of any other elements.

In the drawings, the thickness of layers, films, panels, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

Further, the singular includes the plural unless mentioned otherwise. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±10% or ±5% of the stated value.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, when a definition is not otherwise provided, "substituted" refers to replacement of hydrogen of a compound by a substituent such as a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, halogen (—F, —Cl, —Br or —I), a hydroxy group (—OH), a nitro group (—NO$_2$), a cyano group (—CN), an amino or amine group (—NRR' wherein R and R' are each independently hydrogen or a C1 to C6 alkyl group), an azido group (—N$_3$), an amidino group (—O(=NH)NH$_2$), a hydrazino group (—NHNH$_2$), a hydrazono group (=N(NH$_2$)), an aldehyde group (—C(=O)H), a carbamoyl group (—C(O)NH$_2$), a thiol group (—SH), an ester group (—C(=O)OR, wherein R is a C1 to C6 alkyl group or a C6 to C12 aryl group), a carboxyl group (—COOH) or a salt thereof (—C(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), or a combination thereof.

As used herein, when a definition is not otherwise provided, "hetero" refers to inclusion of one to three heteroatoms such as N, O, S, Si, or P.

As used herein, when a definition is not otherwise provided, "aliphatic hydrocarbon group" may refer to a C1 to C30 linear or branched alkyl group, a C2 to C30 linear or branched alkenyl group, or a C2 to C30 linear or branched alkynyl group.

As used herein, when a definition is not otherwise provided, "aromatic" may refer to a C6 to C30 aryl group or a C2 to C30 heteroaryl group.

As used herein, when a definition is not otherwise provided, "(meth)acrylate" refers to acrylate, methacrylate, or a combination thereof. The (meth)acrylate may include a (C1 to C10 alkyl)acrylate, a (C1 to C10 alkyl)methacrylate, or a combination thereof.

As used herein, "dispersion" refers to dispersion wherein a dispersed phase is a solid and a continuous phase includes a liquid. For example, "dispersion" may refer to a colloidal dispersion wherein the dispersed phase has a dimension of greater than or equal to about 1 nm, for example, greater than or equal to about 2 nm, greater than or equal to about 3 nm, or greater than or equal to about 4 nm and several micrometers (μm) or less (e.g., about 2 μm or less or about 1 μm or less).

As used herein, the term light conversion efficiency refers to a percentage of a light emission (A) of a quantum dot composite with respect to excitation light (e.g., blue light) (B). As used herein, a light absorption refers to a percentage of an amount of light absorbed by a quantum dot composite with respect to an amount of incident light (e.g., blue light). The total amount of excitation light (B) is obtained by integration of a luminescence spectrum of the incident light, an amount (B') of incident light passing through the quantum dot-polymer composite film is obtained, and the light conversion rate, the light conversion efficiency, and the light absorption rate are obtained by the following equation:

$(A/B) \times 100\%$ = light conversion rate (%)

$[A/(B-B')] \times 100\%$ = (blue)light conversion efficiency (CE %)

$((B-B')/B) \times 100\%$ = blue light absorption rate (%)

The term "average" used in this specification (e.g., an average size of the quantum dot) may be mean or median. In an embodiment, the average may be "mean" average.

The quantum efficiency of the quantum dot may be a quantum yield that can be readily and reproducibly measured by any commercially available equipment, for example, from Hitachi Co. Ltd or Hamamatsu Co. Ltd and referring to the instruction manuals provided from the manufacturer. In an embodiment, the quantum efficiency (or quantum yield) may be measured in a solution state or a solid state (in a composite). In an embodiment, "quantum yield (or quantum efficiency)" may be a ratio of photons emitted to photons absorbed, e.g., by a nanostructure or population of nanostructures. In an embodiment, the quantum efficiency may be determined by any method. For example, there may be two methods for measuring the fluorescence quantum yield or efficiency: the absolute method and the relative method. The absolute method directly obtains the quantum yield by detecting all sample fluorescence through the use of an integrating sphere. In the relative method, the fluorescence intensity of a standard sample (e.g., a standard dye) may be compared with the fluorescence intensity of an unknown sample to calculate the quantum yield of the unknown sample. Coumarin 153, Coumarin 545, Rhodamine 101 inner salt, Anthracene, and Rhodamine 6G may be used as standard dye, depending on the photoluminescence (PL) wavelengths, but are not limited thereto.

The full width at half maximum (FWHM) and the maximum PL peak wavelength may be determined by a photoluminescent spectrum obtained by a spectrophotometer (or Fluorescence Spectrophotometer).

As used herein, the expression "not including cadmium (or other harmful heavy metal)" may refer to the case in which a concentration of cadmium (or other harmful heavy metal) may be less than or equal to about 100 parts per million by weight (ppmw), less than or equal to about 50 ppmw, less than or equal to about 10 ppmw, less than or equal to about 1 ppmw, less than or equal to about 0.1 ppmw, less than or equal to about 0.01 ppmw, or about zero. In an embodiment, substantially no amount of cadmium (or other harmful heavy metal) may be present or, if present, an amount of cadmium (or other harmful heavy metal) may be less than or equal to a detection limit or as an impurity level of a given analysis tool (e.g., an inductively coupled plasma atomic emission spectroscopy).

As used herein, "first absorption peak" or a wavelength thereof refers to a main peak appearing first in the lowest energy region in an ultraviolet-visible absorption spectrum and a wavelength thereof.

A quantum dot (or a semiconductor nanocrystal particle) is a crystalline semiconductor material having a size of several nanometers. The quantum dot may have a large surface area per a unit volume and may exhibit a quantum confinement effect. A quantum dot may absorb light from an excitation source to be excited, and may emit energy corresponding to a bandgap energy of the quantum dot.

Quantum dots have potential applicability to, e.g., in, various electronic devices due to unique photoluminescence characteristics of the quantum dots. Quantum dots having properties that may be applicable to, e.g., used in, electronic devices and the like are may be cadmium-based quantum dots. However, cadmium may cause environment/health problems and thus is a restricted element. Cadmium-free quantum dots (hereinafter, also referred to as non-cadmium quantum dots) may be, e.g., include, for example a Group III-V-based nanocrystal. Non-cadmium quantum dots may have inferior photoluminescence properties (e.g., blue light absorption) and stability compared with cadmium-based quantum dots. Blue light (e.g., having a wavelength of about 450 nm) may be used as an energy excitation source for the quantum dot. Cadmium-based quantum dots may have high absorption intensity for blue light but in the case of non-cadmium-based quantum dots, an absorption intensity at, e.g., of, blue light (e.g., wavelength of about 450 nm) may not be high, and a display device including non-cadmium-based quantum dots may exhibit reduced luminance.

In an LCD device, polarized light from a liquid crystal layer passes (through) an absorption type color filter and expresses a color and thus the liquid crystal display (LCD) device may have problems of a narrow viewing angle as well as a deteriorated luminance due to a low light transmittance of the absorption type color filter. A photoluminescent type color filter may be an alternative to overcome technical limits of the LCD device including the absorption type color filter. A quantum dot-based color filter may use blue light instead of white light as an excitation light, and a color filter may be disposed in front of the display device to convert the excitation light to the desirable light (e.g., green light/red light). Therefore, a quantum dot-based color filter may reduce, e.g., minimize or solve, technical problems of, for example, a liquid crystal display (e.g., narrow viewing angle and light loss). Light with linearity (passing through the liquid crystal layer and going straight) may be scattered in all directions, and this may reduce, e.g., minimize or solve, a viewing angle problem. The optical loss that may occur by using the absorption type color filter may also be reduced or minimized.

However, when employing a quantum dot-based color filter, the excitation light propagating in the forward direction of the display device (e.g., in a red or green light emitting section) may become a technical problem and it may be desirable to block the excitation light propagating in the forward direction of the device. Non-cadmium-based quantum dot may not provide enough absorption to block excitation light propagating in the forward direction of the device.

The introduction of light scatterers may improve absorption. However, light scatterers may increase manufacturing cost. A light scatterer may have a high external light reflectance, which may cause an increase in external light reflection, and an increased solid content caused by a light scatterer may provide additional difficulties in the process. In order to block the excitation light, a blue cut filter may be used, which may cause an additional cost and the increase of the external light reflection, and may lead to optical loss, contrast deterioration, and an image sharpness reduction of the display device.

The quantum dot(s) according to an embodiment may exhibit increased blue light absorption (or blue light absorption rate) while not including cadmium, and the above problems may be reduced, e.g., minimized or solved. In case of the quantum dot according to an embodiment, such an increased excitation light absorption may contribute to suppressing blue light leakage at, e.g., with, a reduced amount, e.g., number, of light scatterers, without using a blue(excitation) light cut filter, or a combination thereof.

In an embodiment, a quantum dot (or quantum dots, hereinafter, may be referred to as quantum dot) does not include cadmium.

Referring to FIG. 1, a quantum dot of an embodiment includes a template including a first semiconductor nanocrystal, and a quantum well layer disposed on the template and including an alloy semiconductor nanocrystal. The quantum well layer may surround a portion of (or an entirety of) a surface of the template. A shell including a second semiconductor nanocrystal may be disposed on the quantum well layer.

A bandgap energy of the alloy semiconductor nanocrystal is smaller, e.g., less, than a bandgap energy of the first semiconductor nanocrystal and smaller, e.g., less, than a bandgap energy of the second semiconductor nanocrystal (if present). Referring to FIG. 1, in an energy band alignment, a valence band edge and a conduction band edge of the alloy semiconductor nanocrystal may be within the bandgap of the first semiconductor nanocrystal. The valence band edge and the conduction band edge of the alloy semiconductor nanocrystal may be within the bandgap of the second semiconductor nanocrystal. A bandgap energy may be known for a bulk material (e.g., ZnSe, InP, ZnS, ZnSeS, or the like) or may be calculated therefrom.

The bandgap energy of the first semiconductor nanocrystal and the bandgap energy of the second semiconductor nanocrystal may be the same or different. In an embodiment, the bandgap energy of the first semiconductor nanocrystal may be less than the bandgap energy of the second semiconductor nanocrystal. In an embodiment, the bandgap energy of the first semiconductor nanocrystal may be greater than or equal to the bandgap energy of the second semiconductor nanocrystal.

The first semiconductor nanocrystal and the second semiconductor nanocrystal each independently includes a zinc chalcogenide (e.g., a compound including zinc and a chalcogen element such as selenium, tellurium, sulfur, or a combination thereof). A first zinc chalcogenide included in the first semiconductor nanocrystal and a second zinc chalcogenide included in the second semiconductor nanocrystal may have the same composition with each other. The first zinc chalcogenide and the second zinc chalcogenide may have different compositions with each other.

The zinc chalcogenide (e.g., the first semiconductor nanocrystal or the second semiconductor nanocrystal) may include ZnSe, ZnTeSe, ZnSeS, ZnS, ZnTeS, or a combination thereof. The first semiconductor nanocrystal may include zinc and selenium. The first semiconductor nanocrystal may include ZnSe, ZnSeS, ZnTeSe, or a combination thereof. The first semiconductor nanocrystal may include ZnSe. In an embodiment, the first semiconductor nanocrystal may include zinc and sulfur.

In an embodiment, the second semiconductor nanocrystal may include zinc and sulfur. The second semiconductor nanocrystal may include ZnSeS, ZnS, or a combination thereof. The shell may be a multi-layered shell. The multi-layered shell may include a first layer including a third zinc chalcogenide and a second layer disposed (e.g., directly) on the first layer and including a fourth zinc chalcogenide. The fourth zinc chalcogenide may include a different composition from the third zinc chalcogenide. The first layer and the second layer may be (e.g., directly) on (e.g., in contact with) each other. The first layer may be disposed directly on the quantum well layer. The first layer and the second layer may include zinc chalcogenides each having different compositions. The third zinc chalcogenide may include ZnSe, ZnTeSe, ZnSeS, ZnS, or a combination thereof, and the fourth zinc chalcogenide may independently include ZnSe, ZnTeSe, ZnSeS, ZnS, or a combination thereof. The first layer may include ZnSe, ZnSeS, or a combination thereof, and the second layer may include ZnS. The shell may have a structure of ZnSe/ZnS. The second shell may constitute, e.g., be, an outermost layer of the shell.

The quantum well layer may be disposed between the template and the shell. The quantum well layer may be configured to absorb an excitation light (e.g., blue light) and to emit light (e.g., band-edge emission) that may be controlled depending on a bandgap energy thereof.

The quantum well layer include an alloy semiconductor nanocrystal including indium (In), phosphorus (P), zinc (Zn), and a chalcogen element. The chalcogen element may not include selenium. The alloy semiconductor nanocrystal may be a ternary alloy of InPZnS. The quantum well layer may include a relatively homogenous alloy composition for example in a thickness direction of the quantum well layer.

In the quantum dot of an embodiment, a quantum well layer having a relatively narrow bandgap is disposed on a template having a relatively wide bandgap, and a passivation shell may be coated on the quantum well layer. The quantum well layer may play a role of an emissive center. A colloidal semiconductor nanocrystal particle having such a quantum well structure (hereinafter, may also referred to as a quantum well (QW) quantum dot) may exhibit improved blue light absorption in comparison with a core-shell quantum dot having a similar structure. Without wishing to be bound by any theory, it is believed that the quantum well layer may realize, e.g., exhibit, increased volume in comparison with an emission core of the same composition, which may enhance the light absorption. However, the QW quantum dot may tend to show, e.g., exhibit, a significant red shift in an emission wavelength of the QW quantum dot, which may make it difficult for the QW quantum dot to have a desired wavelength of light (e.g., in a green light region)

Without wishing to be bound by any theory, it is believed that the QW quantum dot may have an interface between the template and the emission layer and an interface between the emission layer and the shell, and thus may have much wider area than that of a core shell quantum dot having a similar composition. Accordingly, the emission layer may tend to have a greater number of defects and a uniform growth of the particle may be seriously hindered.

Without wishing to be bound by any theory, it is believed that in light of energy level, the quantum dot having a quantum well structure may have an excess number of tail states not only in the top of the conduction band but also in the bottom of the valence band, which may also cause a red shift of the photoluminescent wavelength.

Surprisingly, the present inventors have found that by the introduction of the aforementioned alloy composition to the quantum well layer, the quantum dot of an embodiment may relieve a red shift problem substantially without any adverse effect. Without wishing to be bound by any theory, it is believed that the alloy semiconductor nanocrystal provided with the quantum well layer may significantly reduce lattice mismatch at an interface between the template and the quantum well layer (and at an interface between the quantum well layer and the shell). Such a reduced lattice mismatch may control the number of the defects in the formation of the quantum well layer and successively the formation of the shell and may also contribute an uniform growth of the particle, making it possible to control the emissive wavelength substantially without causing an adverse effect such as a decrease of an efficiency.

In case of the quantum dot of an embodiment, a thickness of the quantum well layer for emission of a desired wavelength may increase, and this may also reduce a structural disorder.

In the quantum dot of an embodiment, a difference between a lattice mismatch of the alloy semiconductor nanocrystal and a lattice mismatch of the first semiconductor nanocrystal may be less than or equal to about 3%. In the quantum dot of an embodiment, a difference between a lattice mismatch of the alloy semiconductor nanocrystal and a lattice mismatch of the second semiconductor nanocrystal may be less than or equal to about 3%. The quantum dot of an embodiment may emit light of a desired wavelength with a relatively high emission efficiency and a polymer composite film including the same may show, e.g., exhibit, improved absorption together with an increased level of a light conversion rate or a photoconversion efficiency (CE %).

In an embodiment, the quantum well layer may include $In_{1-x}P_{1-y}Zn_xS_y$ (wherein the x is greater than 0, greater than or equal to about 0.01, greater than or equal to about 0.05, greater than or equal to about 0.1, greater than or equal to about 0.2, greater than or equal to about 0.3, greater than or equal to about 0.4, greater than or equal to about 0.5 and less than about 1, less than or equal to about 0.95, less than or equal to about 0.9, less than or equal to about 0.85, less than or equal to about 0.8, less than or equal to about 0.75, less than or equal to about 0.7, or less than or equal to about 0.6, y is greater than 0, greater than or equal to about 0.01, greater than or equal to about 0.05, greater than or equal to about 0.1, greater than or equal to about 0.2, greater than or equal to about 0.3, greater than or equal to about 0.4, greater than or equal to about 0.5 and less than about 1, less than or equal to about 0.95, less than or equal to about 0.9, less than or equal to about 0.85, less than or equal to about 0.8, less than or equal to about 0.75, less than or equal to about 0.7, less than or equal to about 0.6, or less than or equal to about 0.55).

In a quantum dot of an embodiment, the template may include zinc and selenium and the quantum well layer may include $In_{1-x}P_{1-y}Zn_xS_y$, and the shell may include zinc and sulfur. The shell may be a multi-layered shell and an outermost layer may include ZnS. The shell may further include selenium.

In the quantum dot of an embodiment, a total mole amount of the indium and the phosphorus may be (as determined by an appropriate analysis tool such as XPS, ICP, or the like) based on a total mole number of all elements of the quantum dot, less than or equal to about 20%, less than or equal to about 19%, less than or equal to about 18%, less than or equal to about 17%, less than or equal to about 16%, less than or equal to about 15%, less than or equal to about 14%, less than or equal to about 13%, less than or equal to about 12%, less than or equal to about 11%, less than or equal to about 10%, less than or equal to about 9%, less than or equal to about 8%, less than or equal to about 7%, less than or equal to about 6%, less than or equal to about 5%, less than or equal to about 4%, or less than or equal to about 3%. The total mole amount of the indium and the phosphorus may be, based on a total quantum dot, greater than or equal to about 0.01%, greater than or equal to about 0.05%, greater than or equal to about 0.1%, greater than or equal to about 0.2%, greater than or equal to about 0.3%, greater than or equal to about 0.4%, greater than or equal to about 0.5%, greater than or equal to about 0.6%, greater than or equal to about 0.7%, greater than or equal to about 0.8%, greater than or equal to about 0.9%, or greater than or equal to about 1%.

As used herein, an amount of each component in the quantum dot may be measured (or determined) by using an ICP, an XPS, or another appropriate measure.

In the quantum dot of an embodiment, a mole ratio of zinc with respect to indium may be greater than or equal to about 7:1, greater than or equal to about 9:1, greater than or equal to about 10:1, greater than or equal to about 13:1, greater than or equal to about 15:1, greater than or equal to about 18:1, greater than or equal to about 20:1, greater than or equal to about 22:1, greater than or equal to about 23:1, greater than or equal to about 24:1, greater than or equal to about 25:1, greater than or equal to about 26:1, greater than or equal to about 27:1, greater than or equal to about 28:1, greater than or equal to about 29:1, or greater than or equal to about 30:1. In the quantum dot of an embodiment, a mole ratio of zinc with respect to indium may be less than or equal to about 55:1, less than or equal to about 50:1, less than or equal to about 45:1, less than or equal to about 40:1, less than or equal to about 35:1, less than or equal to about 30:1, less than or equal to about 25:1, or less than or equal to about 23:1.

In the quantum dot of an embodiment, a mole ratio of phosphorus with respect to indium may be greater than or equal to about 0.2:1, greater than or equal to about 0.3:1, greater than or equal to about 0.4:1, greater than or equal to about 0.5:1, greater than or equal to about 0.51:1, greater than or equal to about 0.52:1, greater than or equal to about 0.53:1, greater than or equal to about 0.54:1, greater than or equal to about 0.55:1, greater than or equal to about 0.56:1, greater than or equal to about 0.57:1, greater than or equal to about 0.58:1, greater than or equal to about 0.59:1, greater than or equal to about 0.6:1, greater than or equal to about 0.65:1, greater than or equal to about 0.7:1, or greater than or equal to about 0.75:1. In the quantum dot of an embodiment, a mole ratio of phosphorus with respect to indium may be less than or equal to about 1.5:1, less than or equal to about 1.4:1, less than or equal to about 1.3:1, less than or equal to about 1.2:1, less than or equal to about 1.1:1, less than or equal to about 1.09:1, less than or equal to about 1.08:1, less than or equal to about 1.07:1, less than or equal to about 1.06:1, less than or equal to about 1.05:1, less than or equal to about 1.04:1, less than or equal to about 1.03:1, less than or equal to about 1.02:1, less than or equal to about 1.01:1, less than or equal to about 1:1, less than or equal to about 0.95:1, less than or equal to about 0.9:1, less than or equal to about 0.85:1, or less than or equal to about 0.75:1.

In the quantum dot of an embodiment, a mole ratio of a sum of sulfur and selenium with respect to zinc may be greater than or equal to about 0.5:1, greater than or equal to about 0.6:1, greater than or equal to about 0.7:1, or greater than or equal to about 0.8:1 and less than or equal to about 1:1, less than or equal to about 0.9:1, less than or equal to about 0.85:1, or less than or equal to about 0.8:1.

In the quantum dot of an embodiment, a mole ratio of sulfur with respect to selenium may be less than or equal to about 1:1, less than or equal to about 0.9:1, less than or equal to about 0.8:1, less than or equal to about 0.7:1, less than or equal to about 0.6:1, less than or equal to about 0.5:1, less than or equal to about 0.4:1, less than or equal to about 0.39:1, or less than or equal to about 0.3:1 and greater than or equal to about 0.2:1, greater than or equal to about 0.3:1, greater than or equal to about 0.34:1, greater than or equal to about 0.4:1. In the quantum dot of an embodiment, a mole ratio of selenium with respect to indium may be greater than or equal to about 9:1, greater than or equal to about 10:1, or greater than or equal to about 11:1. In the quantum dot of an embodiment, a mole ratio of selenium with respect to indium may be less than or equal to about 40:1, less than or equal to about 35:1, less than or equal to about 30:1, less than or equal to about 25:1, less than or equal to about 20:1, less than or equal to about 15:1, or less than or equal to about 13:1. In the quantum dot of an embodiment, a mole ratio of selenium with respect to indium may be greater than or equal to about 5:1, greater than or equal to about 6:1, greater than or equal to about 7:1, greater than or equal to about 8:1, greater than or equal to about 9:1, or greater than or equal to about 10:1.

In the quantum dot of an embodiment, a mole ratio of sulfur with respect to indium may be greater than or equal to about 5:1, greater than or equal to about 6:1, greater than or equal to about 7:1, greater than or equal to about 8:1, greater than or equal to about 9:1, or greater than or equal to about 10:1. In the quantum dot of an embodiment, a mole ratio of sulfur with respect to indium may be less than or equal to about 15:1, less than or equal to about 12:1, or less than or equal to about 10:1

In the quantum dot of an embodiment, a mole ratio of zinc with respect to selenium may be less than or equal to about 3:1, or less than or equal to about 2:1. In the quantum dot of an embodiment, a mole ratio of zinc with respect to selenium may be greater than or equal to about 1.5:1.

In the quantum dot of an embodiment, a mole ratio of indium with respect to selenium (or a mole ratio of phosphorus with respect to selenium) may be less than or equal to about 0.2:1, less than or equal to about 0.1:1, less than or equal to about 0.09:1, less than or equal to about 0.08:1, less than or equal to about 0.07:1, or less than or equal to about 0.06:1; and/or greater than or equal to about 0.05:1.

A size (e.g., a diameter or an equivalent diameter) of the template or a thickness of the quantum well layer may be controlled taking into consideration a desired wavelength and a composition of the quantum dot. In the quantum dot of an embodiment, a size of the template may be greater than or equal to about 0.8 nm, greater than or equal to about 1 nm, greater than or equal to about 1.1 nm, greater than or equal to about 1.2 nm, greater than or equal to about 1.3 nm, greater than or equal to about 1.4 nm, greater than or equal to about 1.5 nm, greater than or equal to about 1.6 nm, greater than or equal to about 1.7 nm, greater than or equal to about 1.8 nm, greater than or equal to about 1.9 nm, greater than or equal to about 2 nm, greater than or equal to about 2.1 nm, greater than or equal to about 2.2 nm, greater than or equal to about 2.3 nm, greater than or equal to about 2.4 nm, greater than or equal to about 2.5 nm, greater than or equal to about 2.6 nm, greater than or equal to about 2.7 nm, greater than or equal to about 2.8 nm, greater than or equal to about 2.9 nm, or greater than or equal to about 3.0 nm. The size of the template may be less than or equal to about 5 nm, less than or equal to about 4 nm, less than or equal to about 3.5 nm, less than or equal to about 3.45 nm, less than or equal to about 3.4 nm, less than or equal to about 3.3 nm, less than or equal to about 3.2 nm, less than or equal to about 3.1 nm, less than or equal to about 3 nm, less than or equal to about 2.9 nm, less than or equal to about 2.8 nm, less than or equal to about 2.7 nm, less than or equal to about 2.6 nm, less than or equal to about 2.5 nm, less than or equal to about 2.4 nm, less than or equal to about 2.3 nm, less than or equal to about 2.2 nm, less than or equal to about 2.1 nm, or less than or equal to about 2 nm.

A thickness of the quantum well layer may be greater than or equal to about 0.05 nm, greater than or equal to about 0.1 nm, greater than or equal to about 0.15 nm, greater than or equal to about 0.2 nm, greater than or equal to about 0.25 nm, greater than or equal to about 0.3 nm, greater than or equal to about 0.35 nm, greater than or equal to about 0.4 nm, greater than or equal to about 0.45 nm, or greater than or equal to about 0.5 nm. A thickness of the quantum well layer may be less than or equal to about 1.5 nm, less than or equal to about 1.4 nm, less than or equal to about 1.35 nm, less than or equal to about 1.33 nm, less than or equal to about 1.32 nm, less than or equal to about 1.31 nm, less than or equal to about 1.3 nm, less than or equal to about 1.2 nm, less than or equal to about 1.1 nm, less than or equal to about 1.0 nm, less than or equal to about 0.9 nm, less than or equal to about 0.8 nm, less than or equal to about 0.7 nm, less than or equal to about 0.6 nm, less than or equal to about 0.5 nm, or less than or equal to about 0.35 nm.

A thickness of the shell may be greater than or equal to about 0.3 nm, greater than or equal to about 0.4 nm, greater than or equal to about 0.5 nm, greater than or equal to about 0.6 nm, greater than or equal to about 0.7 nm, greater than or equal to about 0.8 nm, greater than or equal to about 0.9 nm, greater than or equal to about 1 nm, greater than or equal to about 1.1 nm, greater than or equal to about 1.2 nm, greater than or equal to about 1.3 nm, greater than or equal to about 1.4 nm, or greater than or equal to about 1.5 nm and less than or equal to about 4 nm, less than or equal to about 3.5 nm, less than or equal to about 3.0 nm, less than or equal to about 2.9 nm, less than or equal to about 2.8, less than or equal to about 2.7 nm, less than or equal to about 2.6 nm, less than or equal to about 2.4 nm, less than or equal to about 2.3 nm, less than or equal to about 2.2 nm, less than or equal to about 2.1 nm, less than or equal to about 2.0 nm, less than or equal to about 1.5 nm, less than or equal to about 1 nm, less than or equal to about 0.8 nm, or less than or equal to about 0.6 nm.

In an embodiment, a size (or an average size) of the quantum dot(s) may be greater than or equal to about 3 nm, greater than or equal to about 4 nm, greater than or equal to about 5 nm, or greater than or equal to about 6 nm. In an embodiment, a size (or an average size) of the quantum dot(s) may be less than or equal to about 20 nm, less than or equal to about 19 nm, less than or equal to about 18 nm, less than or equal to about 17 nm, less than or equal to about 16 nm, less than or equal to about 15 nm, less than or equal to about 14 nm, less than or equal to about 13 nm, less than or equal to about 12 nm, less than or equal to about 10 nm, less than or equal to about 9 nm, less than or equal to about 8 nm, less than or equal to about 7 nm, less than or equal to about 6 nm, or less than or equal to about 5 nm.

The size of the quantum dots may be a particle diameter. The size of the quantum dots may be a diameter or an equivalent diameter calculated by converting a two-dimensional area identified by transmission electron. As used herein, a dimension such as a size (e.g., a quantum dot-related dimension) may refer to an average (mean or median average) value thereof (e.g., an average size).

The quantum dot may constitute, e.g., be include in, a population of quantum dots emitting green light or red light. An average size of the population of the quantum dots may be greater than or equal to about 3 nm, greater than or equal to about 3.5 nm, greater than or equal to about 4 nm, greater than or equal to about 4.5 nm, greater than or equal to about 5.5 nm, greater than or equal to about 5.6 nm, greater than or equal to about 5.7 nm, greater than or equal to about 5.8 nm, greater than or equal to about 5.9 nm, or greater than or equal to about 6.0 nm. In an embodiment, the quantum dots (e.g., emitting green light) may have a size of less than or equal to about 30 nm, less than or equal to about 25 nm, less than or equal to about 20 nm, less than or equal to about 15 nm, less than or equal to about 14 nm, less than or equal to about 13 nm, less than or equal to about 12 nm, less than or equal to about 11 nm, or less than or equal to about 10 nm.

In an embodiment, the population of the quantum dots may have a particle size distribution of less than or equal to about 20%, less than or equal to about 19%, less than or equal to about 18%, less than or equal to about 17%, less than or equal to about 16%, or less than or equal to about 15% of an average size as a standard deviation.

In an embodiment, the quantum dot may include an organic ligand on a surface thereof. The organic ligand may include RCOOH, $RNH_2$, $R_2NH$, $R_3N$, RSH, $RH_2PO$, $R_2HPO$, $R_3PO$, $RH_2P$, $R_2HP$, $R_3P$, ROH, RCOOR, $RPO(OH)_2$, RPOOH, RHPOOH, $R_2POOH$, or a combination thereof (wherein, R is the same or different and each independently a C1 to C40 aliphatic hydrocarbon group (e.g., a C1 to C40 or a C3 to C24 alkyl group, a C2 to C40 or a C3 to C24 alkenyl group, a C2 to C40 or a C3 to C24 alkynyl group), or a C6 to C40 aromatic hydrocarbon group (e.g., a C6 to C20 aryl group)), or a combination thereof.

The organic ligand may coordinate, e.g., to or be bound to, the surface of the obtained nanocrystal and may help the nanocrystal to be well dispersed in the solution, affect light emitting and electrical characteristics of quantum dots, or a combination thereof.

Examples of the organic ligand may include methane thiol, ethane thiol, propane thiol, butane thiol, pentane thiol, hexane thiol, octane thiol, dodecane thiol, hexadecane thiol, octadecane thiol, or benzyl thiol; methyl amine, ethyl amine, propyl amine, butyl amine, pentyl amine, hexyl amine, octyl amine, dodecyl amine, hexadecyl amine, octadecyl amine, dimethyl amine, diethyl amine, dipropyl amine; methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, or benzoic acid; a phosphine such as a substituted or unsubstituted methyl phosphine (e.g., trimethyl phosphine, methyldiphenyl phosphine, etc.), a substituted or unsubstituted ethyl phosphine (e.g., triethyl phosphine, ethyldiphenyl phosphine, etc.), a substituted or unsubstituted propyl phosphine, a substituted or unsubstituted butyl phosphine, a substituted or unsubstituted pentyl phosphine, or a substituted or unsubstituted octylphosphine (e.g., trioctylphosphine (TOP)); a phosphine oxide such as a substituted or unsubstituted methyl phosphine oxide (e.g., trimethyl phosphine oxide, methyldiphenyl phosphine oxide, etc.), a substituted or unsubstituted ethyl phosphine oxide (e.g., triethyl phosphine oxide, ethyldiphenyl phosphine oxide, etc.), a substituted or unsubstituted propyl phosphine oxide, a substituted or unsubstituted butyl phosphine oxide, or a substituted or unsubstituted octyl phosphine oxide (e.g., trioctylphosphine oxide (TOPO)); diphenyl phosphine, a triphenyl phosphine, or an oxide thereof; a C5 to C20 alkylphosphinic acid or a C5 to C20 alkyl phosphonic acid such as phosphonic acid, hexylphosphinic acid, octylphosphinic acid, dodecanephosphinic acid, tetradecanephosphinic acid, hexadecanephosphinic acid, or octadecanephosphinic acid; and the like, but are not limited thereto. Two or more different organic ligands may be used. The organic ligand may include a mixture of a carboxylic acid compound and an amine compound.

In the quantum dot according to an embodiment, a UV-Vis absorption spectrum curve of the quantum dot may not have an inflection point or a valley (i.e., a point wherein a slope of a tangent line of the curve is changed from a negative value to a positive value) in a wavelength range of greater than or equal to about 390 nm, greater than or equal to about 400 nm, greater than or equal to about 410 nm, greater than or equal to about 415 nm, greater than or equal to about 420 nm, greater than or equal to about 425 nm, greater than or equal to about 430 nm, greater than or equal to about 435 nm, greater than or equal to about 440 nm, greater than or equal to about 445 nm, greater than or equal to about 450 nm, greater than or equal to about 455 nm, greater than or equal to about 460 nm, greater than or equal to about 465 nm, greater than or equal to about 470 nm, greater than or equal to about 475 nm, greater than or equal to about 480 nm, greater than or equal to about 485 nm, or greater than or equal to about 490 nm and less than or equal to about 620 nm, or less than or equal to about 550 nm, less than or equal to about 540 nm, less than or equal to about 530 nm, less than or equal to about 520 nm, less than or equal to about 510 nm, less than or equal to about 500 nm, less than or equal to about 495 nm, less than or equal to about 490 nm, less than or equal to about 485 nm, less than or equal to about 480 nm, less than or equal to about 475 nm, less than or equal to about 470 nm, less than or equal to about 465 nm, less than or equal to about 460 nm, less than or equal to about 455 nm, less than or equal to about 450 nm, less than or equal to about 445 nm, less than or equal to about 440 nm, less than or equal to about 435 nm, less than or equal to about 430 nm, less than or equal to about 425 nm, or less than or equal to about 420 nm (or a combined range of limit values as recited). In an embodiment, the UV-Vis absorption spectrum curve of the quantum dot may not have a first absorption peak. Without wishing to be bound by any theory, it is believed that by the inclusion of the alloy semiconductor nanocrystal in the quantum well layer, the quantum dot may have a UV-Vis absorption spectrum without an inflection point in the aforementioned wavelength range.

As used herein, the inflection point is a point on a curve at which the concavity changes. In an embodiment, the inflection point may be a point on a continuously differentiable plane curve at which the curve crosses a tangent of the curve. In an embodiment, the curve may exhibit a change from concave downward to convex or concave upward, or vice versa.

Without wishing to be bound by any theory, it is believed that the UV-Vis absorption spectrum of an embodiment may suggest that in case of the quantum dot of an embodiment, the emission region is present in the quantum well layer including the alloy semiconductor nanocrystal (unlike the core-shell structure quantum dot), and thus the quantum dot(s) showing, e.g., exhibiting, the disclosed UV-vis absorption spectrum may exhibit an increased blue light absorption together with an increased quantum efficiency.

In the quantum dots of an embodiment, the alloy semiconductor nanocrystal may be included in the quantum well layer, lattice mismatches at interfaces between the template and the quantum well layer and between the quantum well layer and the shell may be relieved, and a bandgap energy of the well layer may be controlled so that a thickness of the quantum well layer for a desired emission wavelength may increase. The quantum dot of an embodiment may address a noticeable red shift problem that may otherwise occur in a final QW structure substantially without causing any adverse effect on luminous properties (e.g., a quantum efficiency).

The quantum dot of an embodiment may emit light (e.g., green light or red light) having a wavelength of a desired range.

The quantum dot or the green light may have a maximum luminescent peak wavelength in a range of greater than or equal to about 490 nm, greater than or equal to about 495 nm, greater than or equal to about 500 nm, greater than or equal to about 505 nm, greater than or equal to about 510 nm, greater than or equal to about 515 nm, or greater than or equal to about 520 nm and less than or equal to about 550 nm, less than or equal to about 545 nm, less than or equal to about 540 nm, less than or equal to about 535 nm, less than or equal to about 530 nm, less than or equal to about 525 nm, or less than or equal to about 520 nm. The quantum dot or the red light may have a maximum luminescent peak wavelength in a range of greater than or equal to about 600 nm, greater than or equal to about 605 nm, greater than or equal to about 610 nm, greater than or equal to about 615 nm, or greater than or equal to about 620 nm and less than or equal to about 650 nm, less than or equal to about 645 nm, less than or equal to about 640 nm, less than or equal to about 635 nm, or less than or equal to about 620 nm.

The quantum dot of an embodiment (or a maximum luminescent peak thereof) may show, e.g., exhibit, a full width at half maximum of less than or equal to about 100 nm, less than or equal to about 80 nm, less than or equal to about 70 nm, less than or equal to about 60 nm, less than or equal to about 50 nm, less than or equal to about 40 nm, or less than or equal to about 35 nm.

The quantum dot of an embodiment may have a quantum efficiency of greater than or equal to about 40%, or greater than or equal to about 50%.

The quantum dot according to an embodiment is prepared by colloid synthesis, and thus may include an organic ligand, an organic solvent, or a combination thereof as described herein on a surface of the quantum dot. The organic ligand, the organic solvent, or a combination thereof may be bound to a surface of the quantum dot.

Accordingly, in an embodiment, a method of producing the aforementioned quantum dot includes obtaining a template including a first semiconductor nanocrystal; forming a quantum well layer including an alloy semiconductor nanocrystal; and if desired forming a shell including a second semiconductor nanocrystal on the quantum well layer.

Details of the template, the quantum well layer, and the shell are the same as described herein. Depending on the composition of the template, the quantum well layer, and the shell, metal and non-metal precursors may be selected appropriately. The metal precursor may include a metal powder, alkylated metal, a metal carboxylate, a metal hydroxide, a metal halide, a metal oxide, a metal inorganic salt (e.g., a metal nitrate, etc.), a metal sulfate, a metal acetylacetonate, or a combination thereof, but is not limited thereto. The non-metal precursor may include a non-nitrogen containing compound used in quantum dot synthesis.

Hereinafter, a production of a quantum dot including a template including a first semiconductor nanocrystal including zinc selenide, a quantum well including a second semiconductor nanocrystal including indium, phosphorus, zinc, and sulfur, and a shell including zinc and a chalcogen element (e.g., sulfur, selenium, or a combination thereof) is described, but the present disclosure is not limited thereto.

For the formation of the template, a zinc precursor and a selenium precursor are reacted in an organic solvent in the presence of an organic ligand. The method may further include separating the formed template.

Details of the organic ligand the same as set forth herein. The organic solvent may be a C6 to C22 primary amine such as hexadecylamine; a C6 to C22 secondary amine such as dioctylamine; a C6 to C40 tertiary amine such as trioctylamine; a nitrogen-containing heterocyclic compound such as pyridine; a C6 to C40 aliphatic hydrocarbon (e.g., alkane, alkene, alkyne, etc.) such as hexadecane, octadecane, octadecene, or squalane; a C6 to C30 aromatic hydrocarbon such as phenyldodecane, phenyltetradecane, or phenyl hexadecane; phosphine substituted with a C6 to C22 alkyl group such as trioctylphosphine; a phosphine oxide substituted with a C6 to C22 alkyl group such as trioctylphosphine oxide; a C12 to C22 aromatic ether such as phenyl ether, or benzyl ether, or a combination thereof. A type and an amount of the organic solvent may be appropriately selected taking into consideration the precursor(s) and organic ligand(s).

The formed template may be separated by addition of a nonsolvent, but is not limited thereto. For example, the addition of a nonsolvent to the prepared final reaction solution may allow nanocrystals coordinated with, e.g., bound to, the organic ligands to be separated (e.g., precipitated). The separated templates may be washed using the nonsolvent. The nonsolvent may be a polar solvent that is miscible with the solvent used in the reaction and nanocrystals are not dispersible therein.

The nonsolvent may be selected depending on the organic solvent used in the reaction and may be for example, acetone, ethanol, butanol, isopropanol, ethanediol, water, tetrahydrofuran (THF), dimethylsulfoxide (DMSO), diethylether, formaldehyde, acetaldehyde, a solvent having a similar solubility parameter to the foregoing solvents, or a combination thereof. The separation may be performed through a centrifugation, precipitation, chromatography, or distillation. The separated nanocrystals may be added to the washing solvent and then washed as desired. The washing solvent is not particularly limited, and a solvent having a solubility parameter similar to that of the organic ligand may be used. Examples thereof may include hexane, heptane, octane, chloroform, toluene, and benzene.

For the formation of the quantum well, an indium precursor, a phosphorus precursor, a zinc precursor, and a chalcogen element containing precursor (e.g., a sulfur precursor) may be added to a reaction medium including an organic solvent, the template, and optionally an organic ligand, simultaneously or sequentially, and reacted therein. In the formation of the quantum well, types and amounts of metal/non-metal precursors may be selected taking into consideration a composition and a thickness of the quantum well. In an embodiment, the formation of the quantum well layer may be carried out an excessive amount of a zinc precursor. An amount of the indium precursor adding to the reaction medium per one mole of zinc may be greater than or equal to about 0.1 mole, greater than or equal to about 0.3 moles, greater than or equal to about 0.5 moles and less than or equal to about 1 mole, less than or equal to about 0.9 moles, less than or equal to about 0.8 moles, less than or equal to about 0.7 moles, less than or equal to about 0.6 moles, less than or equal to about 0.5 moles, or less than or equal to about 0.4 moles.

In an embodiment, similarly to the formation of the template, a particle where the quantum well layer is formed may be separated by adding a nonsolvent to a reaction system. In an embodiment, the particle including the quantum well layer may be subjected to a shell formation reaction without the separation.

A zinc precursor and a chalcogen element containing precursor may be reacted to form a shell having a desired composition on a particle having the formed quantum well layer. For the formation of the multi-layered shell, a desired combination of the shell precursors may be added simultaneously or sequentially to the reaction system to carry out a reaction for forming each layer of the shell.

A reaction temperature in each step set forth herein may be selected taking into consideration types of precursor compounds, an organic ligand, an organic solvent.

A reaction time for the formation of the template, formation of the quantum well layer, formation of the shell, or a combination thereof may be controlled taking into consideration a reactivity between the precursors, a reaction temperature, and a desired thickness or size of a layer or a particle. The reaction temperature may be greater than or equal to about 200° C., for example, greater than or equal to about 210° C., greater than or equal to about 220° C., greater than or equal to about 230° C., greater than or equal to about 240° C., greater than or equal to about 250° C., greater than or equal to about 260° C., greater than or equal to about 270° C., greater than or equal to about 280° C., greater than or equal to about 290° C., or greater than or equal to about 300° C. and less than or equal to about 360° C., less than or equal to about 350° C., or less than or equal to about 340° C., less than or equal to about 330° C., or less than or equal to about 320° C. The reaction time in each step may be less than or equal to about 2 hours, less than or equal to about 1 hour, or less than or equal to about 50 minutes. The reaction time may be greater than or equal to about 20 minutes, for example, greater than or equal to about 30 minutes.

In each of the aforementioned steps, a type, a content, or a combination thereof of the precursors or a ratio therebetween may be determined by taking into consideration a composition thereof in a final quantum dot (a template, a quantum well, and a shell), reactivity thereof, and the like.

Each of the aforementioned steps (e.g., the formation of the template, the formation of the quantum well layer, and the formation of the shell) may include heating (or vacuum-treating) the organic solvent and the metal precursor optionally with a ligand compound at a predetermined temperature (e.g., greater than or equal to about 100° C.) under vacuum and heating them again at a predetermined temperature (e.g., greater than or equal to about 100° C.) after converted into an inert gas atmosphere.

The injection of the metal precursor, the non-metal precursor, or a combination thereof may be made sequentially or simultaneously and a temperature of the injection may be selected appropriately. In an embodiment, during the formation of the multi-layered shell or a multi-layered quantum well, the metal precursors, the non-metal precursors, or a combination thereof may be added in a different ratio (over) several times during the reaction time.

The precursor is not particularly limited and may be appropriately selected. In an embodiment, the zinc precursor may be appropriately selected.

In an embodiment, types of the zinc precursor may be selected appropriately. Examples of the zinc precursor may be a Zn metal powder, an alkylated Zn compound (e.g., dimethyl zinc, diethyl zinc, etc.), Zn alkoxide, Zn carboxylate (e.g., a reaction product between a zinc compound and a carboxylic acid compound having a C8 to C40 alkyl group, such as zinc oleate, zinc laurate, zinc stearate, or the like), Zn nitrate, Zn perchlorate, Zn sulfate, Zn to acetylacetonate, Zn halide, Zn cyanide, Zn hydroxide, Zn oxide, Zn peroxide, or a combination thereof. Two or more different zinc precursor may be used.

The selenium precursor may include selenium-trioctylphosphine (Se-TOP), selenium-tributylphosphine (Se-TBP), selenium-triphenylphosphine (Se-TPP), selenium-diphenylphosphine (Se-DPP), or a combination thereof, but is not limited thereto.

The indium precursor may be appropriately selected. Examples of the indium precursor may be trimethyl indium, an indium carboxylate of C1 or greater, C5 or greater, C10 or greater, or C12 or greater such as indium acetate, indium palmitate, or indium stearate, indium hydroxide, indium chloride, indium oxide, indium nitrate, indium sulfate, or a combination thereof.

The phosphorus precursor may be appropriately selected. Examples of the phosphorus precursor may be tris(trimethylsilyl)phosphine, tris(dimethylamino) phosphine, triethylphosphine, tributylphosphine, trioctylphosphine, triphenylphosphine, tricyclohexylphosphine, or a combination thereof.

The sulfur precursor may be appropriately selected. The sulfur precursor may be a C6 to C20 alkyl (or alkenyl) thiol compound (having a, e.g., at least one thiol group), such as hexane thiol, octane thiol, decane thiol, dodecane thiol, hexadecane thiol, mercapto propyl silane, sulfur-trioctylphosphine (S-TOP), sulfur-tributylphosphine (S-TBP), sulfur-triphenylphosphine (S-TPP), sulfur-trioctylamine (S-TOA), bistrimethylsilyl sulfide, ammonium sulfide, sodium sulfide, or a combination thereof.

In an embodiment, a composition may include (e.g., a plurality of) the aforementioned quantum dot(s); a dispersing agent; and an (organic) solvent, liquid vehicle, or a combination hereof. The dispersing agent may disperse the quantum dots. The composition may further include a carboxylic acid group-containing compound (e.g., a monomer or a binder polymer). The composition may further include a (photo) polymerizable monomer including a carbon-carbon double bond, and optionally (thermal or photo) initiator. The composition may have photosensitivity.

Details of the quantum dots in the composition are as described herein. An amount of quantum dots in the composition may be appropriately adjusted in view of the desired end use (e.g., a color filter, etc.). In an embodiment, the amount of the quantum dot may be greater than or equal to about 1 weight percent (wt %), for example, greater than or equal to about 2 wt %, greater than or equal to about 3 wt %, greater than or equal to about 4 wt %, greater than or equal to about 5 wt %, greater than or equal to about 6 wt %, greater than or equal to about 7 wt %, greater than or equal to about 8 wt %, greater than or equal to about 9 wt %, greater than or equal to about 10 wt %, greater than or equal to about 15 wt %, greater than or equal to about 20 wt %, greater than or equal to about 25 wt %, greater than or equal to about 30 wt %, greater than or equal to about 35 wt %, or greater than or equal to about 40 wt %, based on a solid content of composition. The amount of the quantum dots may be less than or equal to about 70 wt %, for example, less than or equal to about 65 wt %, less than or equal to about 60 wt %, less than or equal to about 55 wt %, or less than or equal to about 50 wt %, based on a solid content of the composition. The weight percentage of the components relative to the total solids content in the composition may represent the contents of the components in the composite, which will be described herein.

The composition according to an embodiment may be used to provide a quantum dot-polymer composite pattern. The composition according to an embodiment may be a photoresist composition including quantum dots applicable to a photolithography method. The composition according to an embodiment may be an ink composition that may provide a pattern by printing (e.g., a droplet discharge method such as inkjet printing). The composition according to an embodiment may not include a conjugated (or conductive) polymer (except a cardo binder that will be described herein). The composition according to an embodiment may include a conjugated polymer. Herein, the conjugated polymer refers to a polymer having a conjugation double bond in a main chain of the polymer (e.g., polyphenylenevinylene, etc.).

In the composition according to an embodiment, the dispersing agent may ensure dispersion of the quantum dots. In an embodiment, the dispersing agent may be a binder (or binder polymer). The binder polymer may include a carboxylic acid group (e.g., in a repeating unit thereof). The binder may be a carboxylic acid group-containing compound (monomer or polymer). The binder may include a carboxylic acid group-containing compound. The binder may be an insulating polymer.

The dispersing agent or the binder polymer may include a monomer combination or a copolymer thereof including a first monomer including a carboxylic acid group and a carbon-carbon double bond, a second monomer having a carbon-carbon double bond, and a hydrophobic moiety and not including a carboxylic acid group, and optionally a third monomer including a carbon-carbon double bond and a hydrophilic moiety and not including a carboxylic acid group; a multiple aromatic ring-containing polymer having a backbone structure where two aromatic rings are bound to a quaternary carbon atom that is a constituent atom of another cyclic moiety in the main chain and including a carboxylic acid group (—COOH) (hereinafter, cardo binder); or a combination thereof. The dispersing agent may include the first monomer, the second monomer, and optionally the third monomer.

In the composition, an amount of the dispersing agent or the binder polymer may be greater than or equal to about 0.5 wt %, for example, greater than or equal to about 1 wt %, greater than or equal to about 5 wt %, greater than or equal to about 10 wt %, greater than or equal to about 15 wt %, or greater than or equal to about 20 wt %, based on a total weight (or the solid content) of the composition, but is not limited thereto. The amount of the binder polymer may be less than or equal to about 55 wt %, for example less than or equal to about 50 wt %, less than or equal to about 40 wt %, less than or equal to about 35 wt %, for example less than or equal to about 33 wt %, or less than or equal to about 30 wt %, based on a total weight (or the solid content) of the composition. The amount of the binder polymer may be about 0.5 wt % to about 55 wt %, based on a total weight of a solid content of the composition.

In the composition, the polymerizable (e.g., photopolymerizable) monomer (hereinafter, may be referred to as "monomer") including the carbon-carbon double bond may include (e.g., photopolymerizable) (meth)acryl-based monomer. The monomer may be a precursor for an insulating polymer.

An amount of the monomer may be greater than or equal to about 0.5 wt %, for example, greater than or equal to about 1 wt %, or greater than or equal to about 2 wt %, based on a total weight of the composition. The amount of the monomer may be less than or equal to about 30 wt %, for example, less than or equal to about 28 wt %, less than or equal to about 25 wt %, less than or equal to about 23 wt %, less than or equal to about 20 wt %, less than or equal to about 18 wt %, less than or equal to about 17 wt %, less than or equal to about 16 wt %, or less than or equal to about 15 wt %, based on a total weight of the composition.

The (photo)initiator included in the composition is a compound that initiates (photo)polymerization of the aforementioned monomers in the composition. The initiator is a compound accelerating a radical reaction (e.g., radical polymerization of monomer) by producing radical chemical species under a mild condition (e.g., by heat or light). The initiator may be a thermal initiator or a photoinitiator. The initiator is not particularly limited and may be appropriately selected.

In the composition, an amount of the initiator may be appropriately adjusted considering types and amounts of the polymerizable monomers. In an embodiment, the amount of the initiator may be greater than or equal to about 0.01 wt %, for example, greater than or equal to about 1 wt % and less than or equal to about 10 wt %, for example, less than or equal to about 9 wt %, less than or equal to about 8 wt %, less than or equal to about 7 wt %, less than or equal to about 6 wt %, or less than or equal to about 5 wt %, based on a total weight (or a total weight of the solid content) of the composition, but is not limited thereto.

The composition (or the polymer matrix that will be described herein) may further include a (multiple or monofunctional) thiol compound having a, e.g., at least one, thiol group for example, at a terminal end thereof, a metal oxide particulate, or a combination thereof.

The metal oxide particulate may include $TiO_2$, $SiO_2$, $BaTiO_3$, $Ba_2TiO_4$, ZnO, or a combination thereof. In the composition, an amount of the metal oxide particulate may be greater than or equal to about 1 wt %, greater than or equal to about 5 wt %, or greater than or equal to about 10 wt % and less than or equal to about 50 wt %, less than or equal to about 40 wt %, less than or equal to about 30 wt %, less than or equal to about 25 wt %, less than or equal to about 20 wt %, less than or equal to about 15 wt %, less than or equal to about 10 wt %, or less than or equal to about 5 wt %, based on a total weight (or a solid content thereof) of the composition.

The metal oxide particulate may have an appropriately selected diameter without a particular limit. The diameter of the metal oxide particulate may be greater than or equal to about 100 nm, for example, greater than or equal to about 150 nm, or greater than or equal to about 200 nm and less than or equal to about 1000 nm or less than or equal to about 800 nm.

The thiol compound may be a dithiol compound, a trithiol compound, a tetrathiol compound, or a combination thereof. For example, the thiol compound may be glycoldi-3-mercaptopropionate, glycoldimercaptoacetate, trimethylolpropane-tris(3-mercaptopropionate), pentaerythritol tetrakis(3-mercaptopropionate), pentaerythritol tetrakis(2-mercaptoacetate), 1,6-hexanedithiol, 1,3-propanedithiol, 1,2-ethanedithiol, polyethylene glycol dithiol including 1 to 10 ethylene glycol repeating units, or a combination thereof.

An amount of the thiol compound may be less than or equal to about 50 wt %, less than or equal to about 40 wt %, less than or equal to about 30 wt %, less than or equal to about 20 wt %, less than or equal to about 10 wt %, less than or equal to about 9 wt %, less than or equal to about 8 wt %, less than or equal to about 7 wt %, less than or equal to about 6 wt %, or less than or equal to about 5 wt %, based on a total weight (or a total weight of the solid content) of the composition. The amount of the thiol compound may be greater than or equal to about 0.1 wt %, for example, greater than or equal to about 0.5 wt %, greater than or equal to about 1 wt %, greater than or equal to about 5 wt %, greater than or equal to about 10 wt %, or greater than or equal to about 15 wt %, based on a total weight (or a total weight of the solid content) of the composition.

The composition may further include an organic solvent (or a liquid vehicle, hereinafter referred to as a solvent). Types of the usable organic solvent are not particularly limited.

Examples of the solvent may include, but are not limited to: ethyl 3-ethoxy propionate; an ethylene glycol series such as ethylene glycol, diethylene glycol, or polyethylene glycol; a glycol ether series such as ethylene glycol monomethyl ether, ethylene glycol monoethyl ether, diethylene glycol monomethyl ether, ethylene glycol diethyl ether, or diethylene glycol dimethyl ether; glycol ether acetates series such as ethylene glycol monomethyl ether acetate, ethylene glycol monoethyl ether acetate, diethylene glycol monoethyl ether acetate, or diethylene glycol monobutyl ether acetate; a propylene glycol series such as propylene glycol; a propylene glycol ether series such as propylene glycol monomethyl ether, propylene glycol monoethyl ether, propylene glycol monopropyl ether, propylene glycol monobutyl ether, propylene glycol dimethyl ether, dipropylene glycol dimethyl ether, propylene glycol diethyl ether, or dipropylene glycol diethyl ether; a propylene glycol ether acetate series such as propylene glycol monomethyl ether acetate or dipropylene glycol monoethyl ether acetate; an amide series such as N-methylpyrrolidone, dimethyl formamide, or dimethyl acetamide; a ketone series such as methyl ethyl ketone (MEK), methyl isobutyl ketone (MIBK), or cyclohexanone; a petroleum product such as toluene, xylene, or solvent naphtha; an ester series such as ethyl acetate, propyl acetate, butyl acetate, cyclohexyl acetate, or ethyl lactate; an ether such as diethyl ether, dipropyl ether, or dibutyl ether; chloroform, a C1 to C40 aliphatic hydrocarbon (e.g., alkane, alkene, or alkyne), a halogen (e.g., chloro) substituted C1 to C40 aliphatic hydrocarbon (e.g., dichloroethane, trichloromethane, or the like), a C6 to C40 aromatic hydrocarbon (e.g., toluene, xylene, or the like), a halogen (e.g., chloro) substituted C6 to C40 aromatic hydrocarbon, or a combination thereof.

Types and amounts of the solvent may be appropriately selected by taking into consideration the aforementioned main components (i.e., the quantum dot, the dispersing agent, the photopolymerizable monomer, the photoinitiator, and if used, the thiol compound), and types and amounts of additives which will be described herein. The composition may include a solvent in a residual amount except for a desired amount of the solid content (non-volatile components).

The composition (e.g., an ink jet composition) may have a viscosity at 25° C. of greater than or equal to about 4 centiPoise (cPs), greater than or equal to about 5 cPs, greater than or equal to about 5.5 cPs, greater than or equal to about 6.0 cPs, or greater than or equal to about 7.0 cPs. The composition (e.g., an ink jet composition) may have a viscosity at 25° C. of less than or equal to about 12 cPs, less than or equal to about 10 cPs, or less than or equal to about 9 cPs.

If the composition is applied in an ink jet process, the composition may be discharged onto a substrate at room temperature and may form a quantum dot polymer composite or a pattern of quantum dot polymer composite, for example, by heating. Together with the disclosed viscosity, the ink composition may have a surface tension at 23° C. of greater than or equal to about 21 milliNewtons per meter (mN/m), greater than or equal to about 22 mN/m, greater than or equal to about 23 mN/m, greater than or equal to about 24 mN/m, greater than or equal to about 25 mN/m, greater than or equal to about 26 mN/m, greater than or equal to about 27 mN/m, greater than or equal to about 28 mN/m, greater than or equal to about 29 mN/m, greater than or equal to about 30 mN/m, or greater than or equal to about 31 mN/m and less than or equal to about 40 mN/m, less than or equal to about 39 mN/m, less than or equal to about 38 mN/m, less than or equal to about 37 mN/m, less than or equal to about 36 mN/m, less than or equal to about 35 mN/m, less than or equal to about 34 mN/m, less than or equal to about 33 mN/m, or less than or equal to about 32 mN/m. A surface tension of the ink composition may be less than or equal to about 31 mN/m, less than or equal to about 30 mN/m, less than or equal to about 29 mN/m, or less than or equal to about 28 mN/m. If desired, the composition may further include various additives such as a light diffusing agent, a leveling agent, or a coupling agent in addition to the aforementioned components.

The components (binder, monomer, solvent, additive, thiol compound, cardo binder, etc.) included in the composition (e.g., a photoresist composition) of an embodiment may be appropriately selected, for details described in, for example, US-2017-0052444-A1 may be referred.

The composition according to an embodiment may be prepared by a method including preparing quantum dot dispersion including the aforementioned quantum dots, dispersing agent, and solvent; and mixing the quantum dot dispersion with the initiator, the polymerizable monomer (e.g., acryl-based monomer), optionally, the thiol compound, optionally, the metal oxide particulates, and optionally, the aforementioned additive. Each of the aforementioned components may be mixed sequentially or simultaneously, but mixing orders are not particularly limited.

The composition may provide a quantum dot-polymer composite by a (e.g., radical) polymerization.

In an embodiment, the quantum dot (polymer) composite includes a polymer matrix; and the aforementioned quantum dot dispersed in the polymer matrix. The (polymer) matrix may include a linear polymer, a crosslinked polymer, or a combination thereof. The crosslinked polymer may include a thiolene resin, crosslinked poly(meth)acrylate, crosslinked polyurethane, a crosslinked epoxy resin, a crosslinked vinyl polymer, a crosslinked silicone resin, or a combination thereof. The linear polymer may include a repeating unit derived from carbon-carbon unsaturated bonds (e.g., carbon-carbon double bond). The repeating unit may include a carboxylic acid group. The linear polymer may include an ethylene repeating unit.

The polymer matrix may include a dispersing agent (e.g., a binder polymer including a carboxylic acid group), a polymerization product (e.g., insulating polymer) of a polymerizable monomer having a carbon-carbon double bond (at least one, for example, at least two, at least three, at least four, or at least five), optionally a polymerization product of the polymerizable monomer and a thiol compound (e.g., a polythiol compound having at least two thiol groups for example, at a terminal end thereof), or a combination thereof. The quantum dot-polymer composite may further include the aforementioned metal oxide particulate.

In an embodiment, the polymer matrix may include a cross-linked polymer and a dispersing agent (e.g., (carboxyl group-contained) binder polymer). The polymer matrix may not include a conjugated polymer (excepting cardo resin). The cross-linked polymer may include a thiolene resin, a cross-linked poly(meth)acrylate, or a combination thereof. In an embodiment, the cross-linked polymer may be a polymerization product of the polymerizable monomer and, optionally, a polythiol compound having at least two thiols (e.g., at a terminal end thereof).

The quantum dot, the dispersing agent, or the binder polymer, the polymerizable monomer, and the polythiol compound may be the same as described herein.

A film of the quantum dot-polymer composite (or a pattern thereof as described herein) may have for example a thickness of less than or equal to about 30 μm, for example, less than or equal to about 25 μm, less than or equal to about 20 μm, less than or equal to about 15 μm, less than or equal to about 10 μm, less than or equal to about 8 μm, or less than or equal to about 7 μm and greater than or equal to about 2 μm, for example, greater than or equal to about 3 μm, greater than or equal to about 3.5 μm, greater than or equal to about 4 μm, greater than or equal to about 5 μm, or greater than or equal to about 6 μm.

In an embodiment, a patterned film includes a repeating section including a first section configured to emit first light, wherein the first section includes the aforementioned quantum dot (polymer) composite. The repeating section may include a second section emitting a second light having different wavelength from the first light, wherein the second section may include a quantum dot polymer composite. The quantum dot polymer composite of the second section may include a second quantum dot configured to emit the second light. The second quantum dot may include the aforementioned quantum dots. The first light or the second light may be red light having a maximum photoluminescence peak wavelength that is between about 600 nm and about 650 nm (e.g., about 620 nm to about 650 nm), or green light having a maximum photoluminescence peak wavelength that is between about 500 nm and about 550 nm (e.g., about 510 nm to about 540 nm). The patterned film may further include a third section emitting a third light (e.g., blue light) different from the first light and the second light. The third light may have a maximum peak wavelength ranging from about 380 nm to about 480 nm. The third section can allow the blue excitation light to pass through the patterned film of the quantum dot polymer composite, as disclosed herein In an embodiment, a display device includes a light source and a photoluminescent element, and the photoluminescent element includes a light emitting layer, and the light emitting layer includes a film or a patterned film of the quantum dot-polymer composite. The light emitting layer may be disposed on a (e.g., transparent) substrate. The light source is configured to provide the photoluminescent element with incident light. The incident light may have a luminescence peak wavelength of greater than or equal to about 440 nm, for example, greater than or equal to about 450 nm and less than or equal to about 500 nm, for example, less than or equal to about 480 nm, less than or equal to about 470 nm, or less than or equal to about 460 nm.

In the light emitting layer (e.g., patterned film of quantum dot polymer composite) of the display device according to an embodiment, the first section may be a section emitting red light, and the second section may be a section emitting green light, and the light source may be an element emitting blue light and optionally green light.

In an embodiment, on a front side (i.e., light emitting face) of the first section and the second section may be disposed a first optical element cutting (e.g., absorbing or reflecting) blue light and optionally green light.

In the aforementioned display device, the light source includes a plurality of light emitting units respectively corresponding to the first section and the second section, and the light emitting units may include a first electrode and a second electrode each having a surface opposite the other and an electroluminescence layer disposed between the first electrode and the second electrode. The electroluminescence layer may include an organic light emitting material. For example, each light emitting unit of the light source may include an electroluminescent device (e.g., an organic light emitting diode (OLED)) configured to emit light of a predetermined wavelength (e.g., blue light, green light, or a combination thereof). Structures and materials of the electroluminescent device and the organic light emitting diode (OLED) are not particularly limited. The light source includes an organic light emitting diode (OLED) emitting blue light (and optionally, green light).

Figure 2:
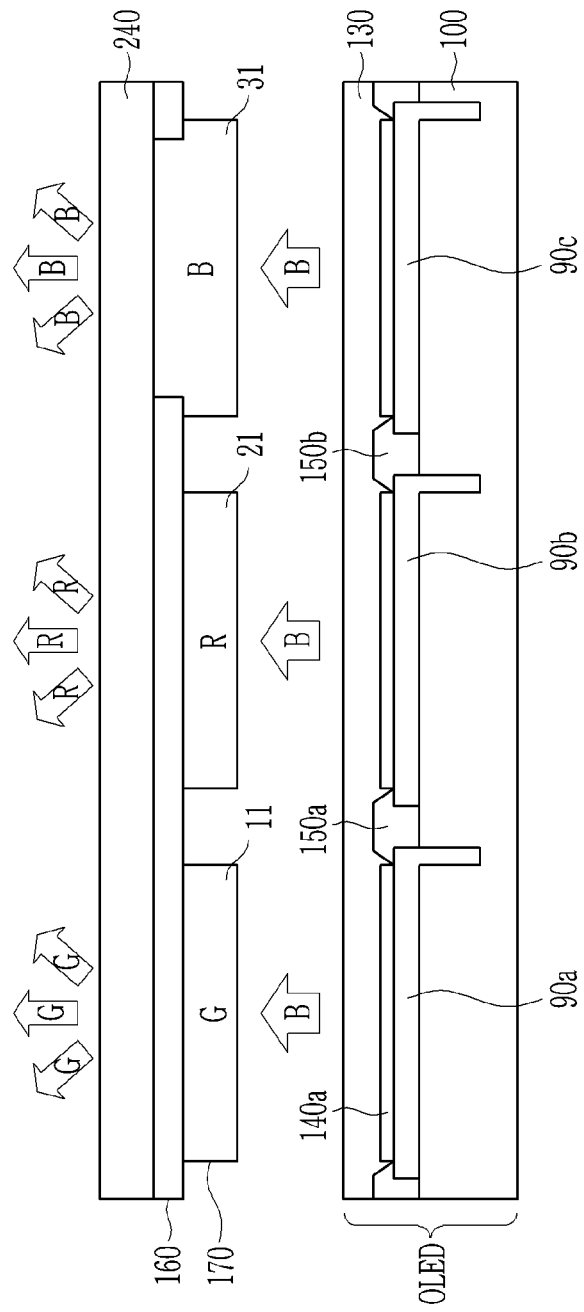
FIG. 2 is a schematic view showing a cross-section of a display device according to an embodiment.
Figure 3:
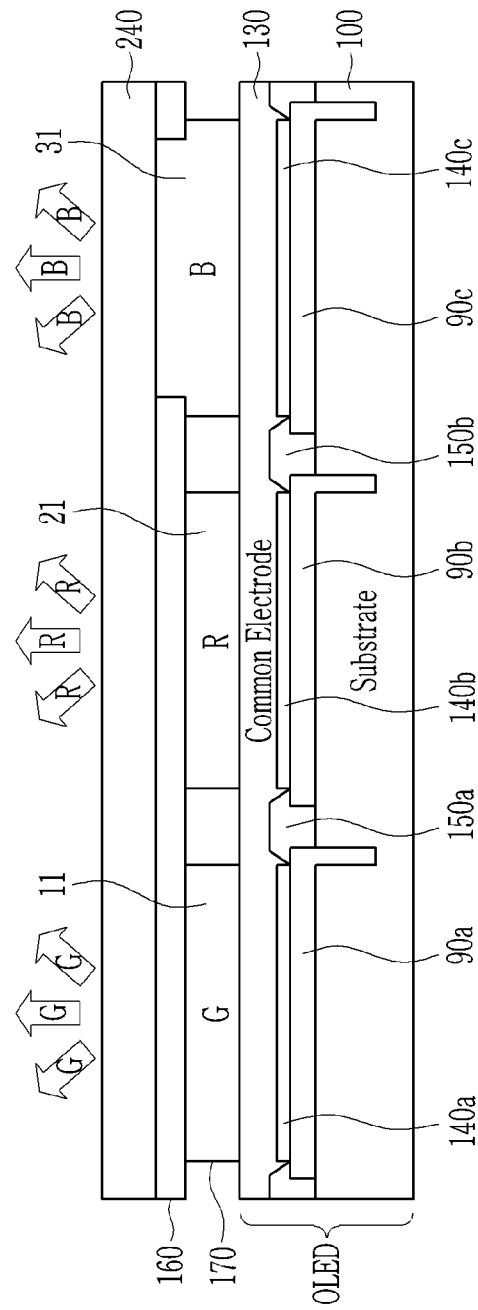
FIG. 3 is a schematic view showing a cross-section of a display device according to an embodiment.

FIG. 2 is a schematic cross-sectional view of a display device according to an embodiment, and FIG. 3 is a schematic cross-sectional view of a display device according to an embodiment. Referring to FIGS. 2 and 3, a light source includes an organic light emitting diode (OLED) emitting blue light. The organic light emitting diode OLED may include (at least two, for example, three or more) pixel electrodes 90a, 90b, 90c formed on a substrate 100, a pixel defining layer 150a, 150b formed between the adjacent pixel electrodes 90a, 90b, 90c, an organic light emitting layer 140a, 140b, 140c formed on the pixel electrodes 90a, 90b, 90c, and a common electrode (layer) 130 formed on the organic light emitting layer 140a, 140b, 140c. A thin film transistor and a substrate may be disposed under the organic light emitting diode (OLED).

A stacked structure including a quantum dot polymer composite pattern 170 (e.g., a section 31 including or not including a quantum dot e.g., emitting blue light, a section 21 including red light emitting quantum dots, and a section 11 including green light emitting quantum dots), optical filter layer 160, and a transparent substrate (or referred to as an upper substrate) 240 may be disposed on the light source. The excitation light (e.g., blue light) emitted from the light source and incident upon the patterned sections is converted to red and green light, respectively. Blue light emitted from the light source may pass through the third section of the patterned quantum dot polymer composite.

The display device may be obtained by separately producing the aforementioned stacked structure and (e.g., blue light emitting) LED or OLED and then assembling the same. The display device may be obtained by forming a quantum dot polymer composite pattern directly on the LED or OLED.

The substrate may be a substrate including an insulating material. The substrate may include glass; various polymers such as a polyester (e.g., polyethylene terephthalate (PET) or polyethylene naphthalate (PEN)), a polycarbonate, or a polyacrylate; a polysiloxane (e.g., polydimethylsiloxane (PDMS)); an inorganic material such as $Al_2O_3$ or ZnO; or a combination thereof, but is not limited thereto. A thickness of the substrate may be appropriately selected considering a substrate material but is not particularly limited. The substrate may have flexibility. The substrate may have a transmittance of greater than or equal to about 50%, greater than or equal to about 60%, greater than or equal to about 70%, greater than or equal to about 80%, or greater than or equal to about 90% for light emitted from the quantum dots.

A wire layer including a thin film transistor or the like is formed on the substrate. The wire layer may further include a gate line, a sustain voltage line, a gate insulating layer, a data line, a source electrode, a drain electrode, a semiconductor, a protective layer, and the like. The detailed structure of the wire layer may be verified according to an embodiment. The gate line and the sustain voltage line are electrically separated from each other, and the data line is insulated and crossing the gate line and the sustain voltage line. The gate electrode, the source electrode, and the drain electrode form a control terminal, an input terminal, and an output terminal of the thin film transistor, respectively. The drain electrode is electrically connected to the pixel electrode that will be described herein.

The pixel electrode may function as an anode of the display device. The pixel electrode may be formed of a transparent conductive material such as indium tin oxide (ITO) or indium zinc oxide (IZO). The pixel electrode may be formed of a material having a light-blocking properties such as gold (Au), platinum (Pt), nickel (Ni), tungsten (W), chromium (Cr), molybdenum (Mo), iron (Fe), cobalt (Co), copper (Cu), palladium (Pd), or titanium (Ti). The pixel electrode may have a two-layered structure in which the transparent conductive material and the material having light-blocking properties are stacked sequentially.

Between two adjacent pixel electrodes, a pixel define layer (PDL) may be overlapped with a terminal end of the pixel electrode to divide the pixel electrode into a pixel unit. The pixel define layer may be an insulation layer which may electrically block the at least two pixel electrodes.

The pixel define layer may cover a portion of the upper surface of the pixel electrode, and the remaining region of the pixel electrode that is not covered by the pixel define layer may provide an opening. An organic emission layer that will be described herein may be formed on the region defined by the opening.

The organic emission layer defines each pixel area by the pixel electrode and the pixel define layer. In other words, one pixel area may be defined as an area formed with one organic emission unit layer which is contacted with one pixel electrode divided by the pixel define layer.

In a display device according to an embodiment, the organic emission layer may be defined as a first pixel area, a second pixel area and a third pixel area, and each pixel area is spaced apart from each other leaving a predetermined interval by the pixel define layer.

In an embodiment, the organic emission layer may emit a third light belong to visible light region or belong to an ultraviolet (UV) region. In other words, each of the first to the third pixel areas of the organic emission layer may emit a third light. In an embodiment, the third light may be a light having the highest energy in the visible light region, for example, may be blue light. When all pixel areas of the organic emission layer are configured to emit the same light, each pixel area of the organic emission layer may be formed of the same or similar materials or may show, e.g., exhibit, the same or similar properties. Thus a process difficulty of forming the organic emission layer may be reduced, e.g., relieved, and the display device may be applied for, e.g., used in, a large scale/large area process. However, the organic emission layer according to an embodiment is not necessarily limited thereto, but the organic emission layer may be configured to emit at least two different lights.

The organic emission layer includes an organic emission unit layer in each pixel area, and each organic emission unit layer may further include an auxiliary layer (e.g., hole injection layer (HIL), hole transport layer (HTL), electron transport layer (ETL), etc.) besides the emission layer.

The common electrode may function as a cathode of the display device. The common electrode may be formed of a transparent conductive material such as indium tin oxide (ITO) or indium zinc oxide (IZO). The common electrode may be formed on the organic emission layer and may be integrated therewith.

A planarization layer or a passivation layer (not shown) may be formed on the common electrode. The planarization layer may include a (e.g., transparent) insulating material for ensuring electrical insulation with the common electrode.

In an embodiment, the display device may further include a lower substrate, a polarizer disposed under the lower substrate, and a liquid crystal layer disposed between the stack structure and the lower substrate, and in the stack structure, the light emission layer may be disposed to face the liquid crystal layer. The display device may further include a polarizer between the liquid crystal layer and the emission layer. The light source may further include LED and if desired, a light guide panel.

Figure 4:
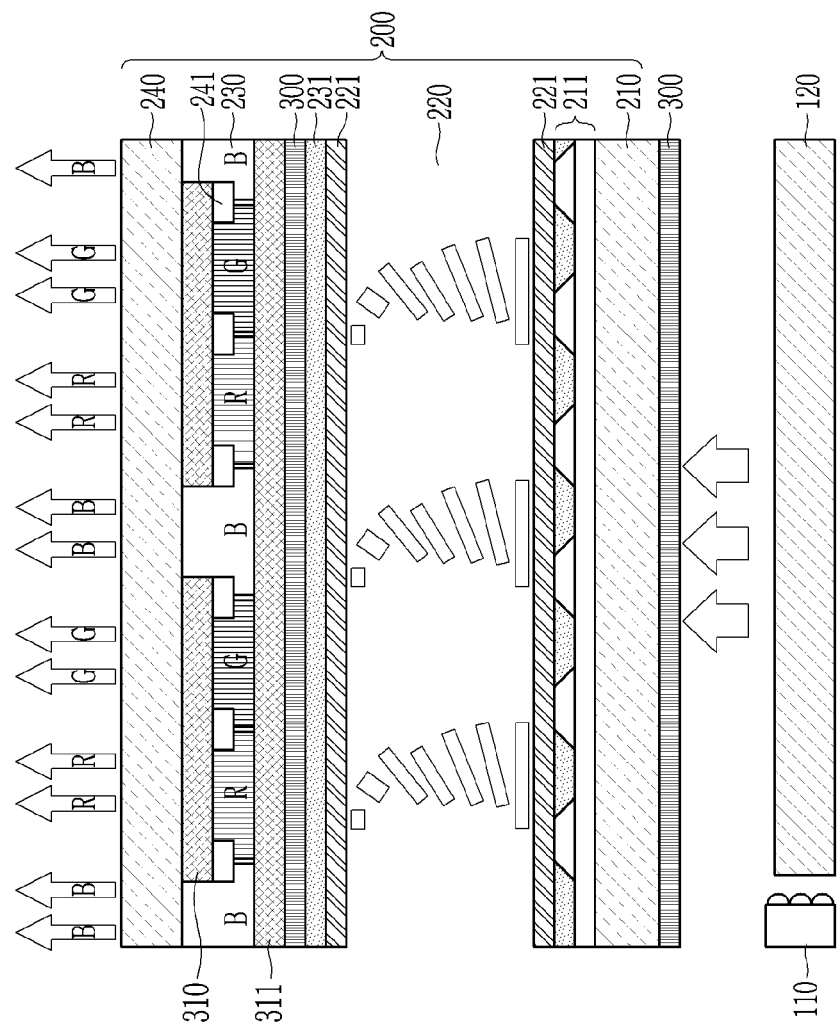
FIG. 4 is a schematic view showing a cross-section of a display device according to an embodiment.

Non-limiting examples of the display device (e.g., a liquid crystal display device) according to an embodiment are illustrated with a reference to a drawing. FIG. 4 is a schematic cross sectional view showing a liquid crystal display according to an embodiment. Referring to FIG. 4, the display device of an embodiment includes a liquid crystal panel 200, a polarizer 300 disposed under the liquid crystal panel 200, and a backlight unit (BLU) disposed under the polarizer 300.

The liquid crystal panel 200 includes a lower substrate 210, a stack structure, and a liquid crystal layer 220 disposed between the stack structure and the lower substrate. The stack structure includes a transparent substrate 240, a first optical filter layer 310, a photoluminescent layer 230 including a pattern of a quantum dot polymer composite, and a second optical filter layer 311.

The lower substrate 210 which is also referred to as an array substrate may be a transparent insulating material substrate. The substrate is the same as described herein. A wire plate 211 is provided on an upper surface of the lower substrate 210. The wire plate 211 may include a plurality of gate lines (not shown) and data lines (not shown) that define a pixel area, a thin film transistor disposed adjacent to a crossing region of gate lines and data lines, and a pixel electrode for each pixel area, but is not limited thereto. Details of such a wire plate are not particularly limited.

The liquid crystal layer 220 may be disposed on the wire plate 211. The liquid crystal panel 200 may include an alignment layer 221 on and under the liquid crystal layer 220 to initially align the liquid crystal material included therein. Details (e.g., a liquid crystal material, an alignment layer material, a method of forming liquid crystal layer, a thickness of liquid crystal layer, or the like) of the liquid crystal layer and the alignment layer are not particularly limited.

A lower polarizer 300 is provided under the lower substrate 210. Materials and structures of the polarizer 300 are not particularly limited. A backlight unit (e.g., emitting blue light) may be disposed under the polarizer 300.

An upper optical element or an upper polarizer 300 may be provided between the liquid crystal layer 220 and the transparent substrate 240, but is not limited thereto. For example, the upper polarizer may be disposed between the liquid crystal layer 220 and the light emission layer 230. The polarizer may be any suitable polarizer for use in a liquid crystal display device. The upper polarizer may be TAC (triacetyl cellulose) having a thickness of less than or equal to about 200 μm, but is not limited thereto. In an embodiment, the upper optical element may be a coating that controls a refractive index without a polarization function.

The backlight unit includes a light source 110. The light source 110 may emit blue light or white light. The light source 110 may include a blue LED, a white LED, a white OLED, or a combination thereof, but is not limited thereto. The backlight unit may further include a light guide panel 120. In an embodiment, the backlight unit may be an edge-type lighting. For example, the backlight unit may include a reflector (not shown), a light guide panel (not shown) provided on the reflector and providing a planar light source with the liquid crystal panel 200, an optical sheet (not shown) on the light guide panel, for example, a diffusion plate, a prism sheet, and the like, or a combination thereof, but is not limited thereto. In an embodiment, backlight unit does not include a light guide panel. In an embodiment, the backlight unit may be a direct lighting. For example, the backlight unit may have a reflector (not shown), and may have a plurality of fluorescent lamps disposed on the reflector at regular intervals, or may have an LED operating substrate on which a plurality of light emitting diodes may be disposed, a diffusion plate thereon, and optionally an optical sheet. Details (e.g., each component of a light emitting diode, a fluorescent lamp, light guide panel, various optical sheets, and a reflector) of such a backlight unit are not particularly limited.

A black matrix (BM) 241 is provided on or under a bottom surface of the transparent substrate 240 and has openings and hides a gate line, a data line, and a thin film transistor of the wire plate on the lower substrate. For example, the black matrix 241 may have a lattice shape. The photoluminescent layer 230 is provided in the openings of the black matrix 241 and has a quantum dot-polymer composite pattern including a first section (R) configured to emit a first light (e.g., red light), a second section (G) configured to emit a second light (e.g., green light), and a third section (B) configured to emit/transmit, for example blue light. If desired, the photoluminescent layer 230 may further include a fourth section. The fourth section may include a quantum dot that emits a light of different color from light emitted from the first to third sections (e.g., cyan, magenta, and yellow light).

In the light emission (photoluminescent) layer 230, sections forming a pattern may be repeated corresponding to pixel areas formed on the lower substrate 210. A transparent common electrode 231 may be provided on the photoluminescent layer (e.g., the photoluminescent color filter layer).

The third section (B) configured to emit/transmit blue light may be a transparent color filter that does not change a photoluminescence spectrum of the light source. In this case, blue light emitted from the backlight unit may enter in a polarized state and may be emitted through the lower polarizer and the liquid crystal layer as is. If desired, the third section may include a quantum dot emitting blue light.

If desired, the display device may further include a blue light blocking layer (e.g., blue cut filter) or a first optical filter layer. The blue light blocking layer or the first optical filter layer may be disposed between (bottom surfaces of) the first section (R) and the second section (G) and the upper substrate 240 or on a top surface of the upper substrate 240. The blue light blocking layer or the first optical filter layer may include a sheet having openings that correspond to a pixel area showing a blue color (e.g., third section) and may be formed on portions corresponding to the first and second sections. As shown in FIG. 4, the first optical filter layer 310 may be integrally formed as one body structure at the remaining positions except positions overlapped with the third section, but is not limited thereto. At least two first optical filter layers may be spaced apart and be disposed on each of the positions overlapped with the first and the second sections.

In an embodiment, the first optical filter layer may block light having a portion of a wavelength region in the visible light region and transmit light having other wavelength regions. In an embodiment, the first optical filter layer may block blue light and transmit light except blue light. In an embodiment, the first optical filter layer may transmit green light, red light, and/or yellow light that is mixed light thereof.

In an embodiment, the first optical filter layer may substantially block blue light having a wavelength of less than or equal to about 500 nm and may transmit light in a visible light having a wavelength in a range of greater than about 500 nm and less than or equal to about 700 nm.

In an embodiment, the first optical filter layer may have light transmittance of greater than or equal to about 70%, greater than or equal to about 80%, greater than or equal to about 90%, or about 100% with respect to the visible light of greater than about 500 nm and less than or equal to about 700 nm.

The first optical filter layer may include a polymer thin film including a dye, a pigment, or a combination thereof that absorbs light having a wavelength to be blocked. The first optical filter layer may block (e.g., absorb) greater than or equal to about 80%, greater than or equal to about 90%, or greater than or equal to about 95% of blue light having a wavelength of less than or equal to about 480 nm and may have light transmittance of greater than or equal to about 70%, greater than or equal to about 80%, greater than or equal to about 90%, or about 100% with respect to other visible light of greater than about 500 nm and less than or equal to about 700 nm.

The first optical filter layer may block (e.g., absorb) or substantially block blue light having a wavelength of less than or equal to about 500 nm and for example may selectively transmit green light or red light. In this case, at least two first optical filter layers may be spaced apart and disposed on each of the portions overlapped with the first and second sections, respectively. For example, a first optical filter layer selectively transmitting red light may be disposed on the portion overlapped with the section emitting red light and the first optical filter layer selectively transmitting green light may be disposed on the portion overlapped with the section emitting green light, respectively. For example, the first optical filter layer may include a first region, a second region, or a combination thereof wherein the first region blocks (e.g., absorb) blue light and red light and transmits light having a wavelength of a predetermined range (e.g., greater than or equal to about 500 nm, greater than or equal to about 510 nm, or greater than or equal to about 515 nm and less than or equal to about 550 nm, less than or equal to about 545 nm, less than or equal to about 540 nm, less than or equal to about 535 nm, less than or equal to about 530 nm, less than or equal to about 525 nm, or less than or equal to about 520 nm) and the second region blocks (e.g., absorb) blue light and green light and transmits light having a wavelength of a predetermined range (e.g., greater than or equal to about 600 nm, greater than or equal to about 610 nm, or greater than or equal to about 615 nm and less than or equal to about 650 nm, less than or equal to about 645 nm, less than or equal to about 640 nm, less than or equal to about 635 nm, less than or equal to about 630 nm, less than or equal to about 625 nm, or less than or equal to about 620 nm). The first region may be disposed at a place overlapped with the section emitting green light and the second region may be disposed at a place overlapped with the section emitting red light. The first region and the second region may be optically isolated. The first optical filter (layer) may contribute to improving color purity of a display device.

The first optical filter layer may be a reflective filter including a plurality of layers (e.g., inorganic material layers) with different refractive index. For example two layers having different refractive index may be alternately stacked with each other, or for example a layer having a high refractive index and a layer having a low refractive index may be alternately stacked with each other.

As the difference of the refractive index is between the layer having a high refractive index and the layer having a low refractive index increases, the first optical filter layer thus formed may have a higher, e.g., greater, wavelength selectivity. A thickness and the stacked number of the layer having a high refractive index and the layer having a low refractive index may be determined according to a refractive index of each layer and a reflected wavelength, for example, each layer having a high refractive index may have a thickness of about 3 nm to about 300 nm, and each layer having a low refractive index may have a thickness of about 3 nm to about 300 nm.

A total thickness of the first optical filter layer may be, for example, about 3 nm to about 10,000 nm, about 300 nm to about 10,000 nm, or about 1,000 nm to about 10,000 nm. All layers having a high refractive index may have the same thickness and the same material or different from each other, and all layers having a low refractive index may have the same thickness and the same material or different from each other.

The display device may further include a second optical filter layer (e.g., red/green or yellow light recycling layer) disposed between the light emission layer and the liquid crystal layer (e.g., between light emission layer and upper polarizer) and transmitting at least a portion of the third light and reflecting at least a portion of the first light and the second light. The second optical filter layer may reflect light in a wavelength region of greater than about 500 nm. The first light may be red light, the second light may be green light, and the third light may be blue light.

In the display device according to an embodiment, the second optical filter layer may be formed as an integrated one layer having a relatively planar surface.

In an embodiment, the second optical filter layer may include a monolayer having a low refractive index, for example, the second optical filter layer may be a transparent thin film having a refractive index of less than or equal to about 1.4, less than or equal to about 1.3, or less than or equal to about 1.2.

The second optical filter layer having a low refractive index may be, for example, a porous silicon oxide, a porous organic material, a porous organic/inorganic composite, or a combination thereof.

In an embodiment, the second optical filter layer may include a plurality of layers having different refractive indexes, for example, the second optical filter layer may be formed by alternately stacking two layers having different refractive indexes, or for example, the second optical filter layer may be formed by alternately stacking a material having a high refractive index and a material having a low refractive index.

The layer having a high refractive index in the second optical filter layer may include, for example, hafnium oxide, tantalum oxide, titanium oxide, zirconium oxide, magnesium oxide, cesium oxide, lanthanum oxide, indium oxide, niobium oxide, aluminum oxide, silicon nitride, or a combination thereof. According to an embodiment, the layer having a high refractive index in the second optical filter layer may include a variety of materials having a higher refractive index than the layer having a low refractive index.

The layer having a low refractive index in the second optical filter layer may include, for example, a silicon oxide. According to an embodiment, the layer having a low refractive index in the second optical filter layer may include a variety of materials having a lower refractive index than the layer having a high refractive index.

As the refractive index difference between the layer having a high refractive index and the layer having a low refractive index increases, the second optical filter layer may have a higher, e.g., greater, wavelength selectivity.

In the second optical filter layer, each thickness of the layer having a high refractive index and the layer having a low refractive index and the stacked number thereof may be determined depending upon a refractive index of each layer and the reflected wavelength. For example, each layer having a high refractive index in the second optical filter layer may have a thickness of about 3 nm to about 300 nm, and each layer having a low refractive index in the second optical filter layer may have a thickness of about 3 nm to about 300 nm. A total thickness of the second optical filter layer may be, for example, from about 3 nm to about 10,000 nm, about 300 nm to about 10,000 nm, or about 1,000 nm to about 10,000 nm. Each of the layer having a high refractive index and the layer having a low refractive index in the second optical filter layer may have the same thickness and materials or different thickness and materials from each other.

The second optical filter layer may reflect at least a portion of the first light (R) and the second light (G) and transmits at least a portion (e.g., whole part) of the third light (B). For example, the second optical filter layer may transmit only the third light (B) in a blue light wavelength region of less than or equal to about 500 nm and light in a wavelength region of greater than about 500 nm, that is, green light (G), yellow light, red light (R), and the like may not pass through the second optical filter layer 311 and may not be reflected. Thus the reflected green light and red light may pass through the first and the second sections to be emitted to the outside of the display device.

The second optical filter layer may reflect a light of a wavelength region of greater than about 500 nm in greater than or equal to about 70%, greater than or equal to about 80%, greater than or equal to about 90%, or about 100%.

Meanwhile, the second optical filter layer may have a transmittance to light of a wavelength region of less than or equal to about 500 nm of, for example, greater than or equal to about 90%, greater than or equal to about 92%, greater than or equal to about 94%, greater than or equal to about 96%, greater than or equal to about 98%, greater than or equal to about 99%, or about 100%.

In an embodiment, the stack structure may be produced by a method using the photoresist composition. The method may include:

forming a film of the composition on a substrate;
exposing a selected region of the film to light (e.g., a wavelength of less than or equal to about 400 nm); and
developing the exposed film with an alkali developing solution to obtain a pattern including the quantum dot-polymer composite.

Figure 5A:
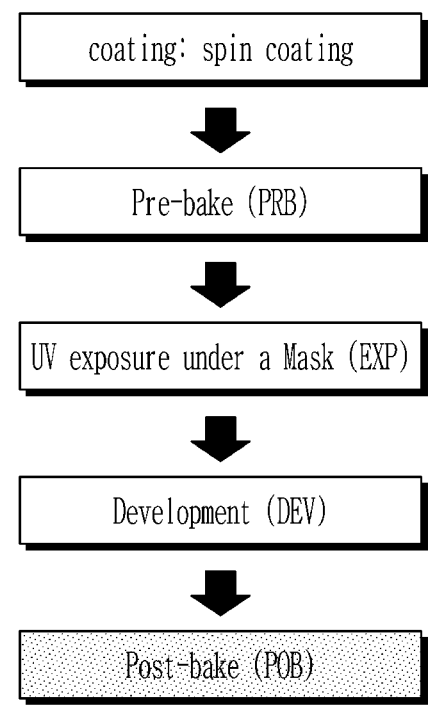
FIG. 5A schematically shows a pattern forming process using a composition according to an embodiment.
Figure 5A:
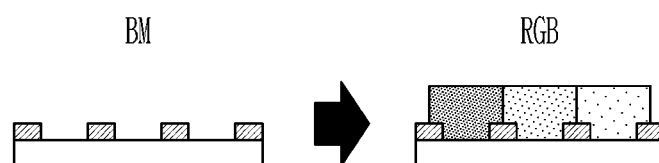

The substrate and the composition are the same as described herein. Non-limiting methods of forming the pattern are illustrated, referring to FIG. 5A.

The composition is coated to have a predetermined thickness on a substrate in an appropriate method of spin coating, slit coating, and the like (S1). The formed film may be, optionally, pre-baked (PRB) (S2). The pre-baking may be performed by selecting appropriate conditions of temperature, time, atmosphere, and the like.

The formed (or optionally pre-baked) film is exposed to light having a predetermined wavelength under a mask having a predetermined pattern (S3). A wavelength and intensity of the light may be selected by taking into consideration the initiator (e.g., photoinitiator), an amount of the initiator (e.g., photoinitiator), the quantum dots, amounts of the quantum dots, and the like.

The exposed film is treated with an alkali developing solution (e.g., dipping or spraying) to dissolve an unexposed region and obtain a desired pattern (S4). The obtained pattern may be, optionally, post-baked (FOB) to improve crack resistance and solvent resistance of the pattern, for example, at about 150° C. to about 230° C. for a predetermined time (e.g., greater than or equal to about 10 minutes or greater than or equal to about 20 minutes) (S5).

In an embodiment in which the quantum dot-polymer composite pattern has a plurality of repeating sections, a quantum dot-polymer composite having a desired pattern may be obtained by preparing a plurality of compositions including a quantum dot having desired photoluminescence properties (a photoluminescence peak wavelength and the like) to form each repeating section (e.g., a red light emitting quantum dot, a green light emitting quantum dot, or optionally, a blue light emitting quantum dot) and an appropriate number of times (e.g., two or more times or three or more times) repeating a formation of the pattern about each composition (S6). For example, the quantum dot-polymer composite may have, e.g., be provided in, a pattern including at least two repeating color sections (e.g., RGB sections). The quantum dot-polymer composite pattern may be used as a photoluminescence-type color filter in a display device.

Figure 5B:
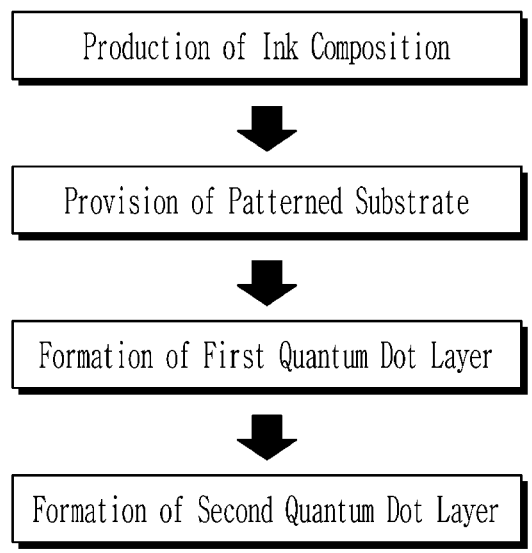
FIG. 5B schematically shows a pattern forming process using a composition according to an embodiment.

A quantum dot composite pattern may be formed by using an ink composition configured to form a pattern via an ink jet manner. Referring to FIG. 5B, the method includes preparing an ink composition; obtaining a substrate including a pattern of, for example, an electrode and optionally an pixel area formed by a bank; depositing an ink composition on the substrate (or the pixel area) to form a first quantum dot layer (or a first repeating section); and depositing an ink composition on the substrate (or the pixel area) to form a second quantum dot layer (or a second repeating section). Formation of the first quantum dot layer and the second quantum dot layer may be carried out simultaneously or sequentially.

Deposition of the ink composition may be carried out using an appropriate droplet discharging system such as an ink jet printer or a nozzle printing system (e.g., having an ink reservoir and a, e.g., at least one, printer head).

The deposited ink composition may be heated to remove a solvent and optionally to carry out a polymerization, and thus, provide a (first or second) quantum dot layer. The method may provide a highly precise quantum dot-polymer composite film or pattern in a simple way for a short time.

An embodiment provides an electronic device including the quantum dot. The electronic device may include a light emitting diode (LED), an organic light emitting diode (OLED), a sensor, a solar cell, an imaging sensor, or a liquid crystal display (LCD), but is not limited thereto.

Hereinafter, the embodiments are illustrated in more detail with reference to examples. However, they are exemplary embodiments of the present invention, and the present invention is not limited thereto.

EXAMPLES

Analysis Methods
1. Ultraviolet-Visible (UV-Vis) Absorption Spectroscopy
A UV-Vis absorption spectroscopy is performed, and a UV-Visible absorption spectrum is obtained by using an Agilent Cary 5000 spectrometer.
2. Photoluminescence Analysis
A photoluminescence (PL) spectrum of a produced quantum dot at an excitation wavelength of 450 nanometers (nm) is obtained using a Hitachi F-7000 spectrophotometer.
3. Inductively Coupled Plasma-Atomic Emission Spectroscopy (ICP-AES)

An inductively coupled plasma-atomic emission spectroscopy (ICP-AES) is performed using Shimadzu ICPS-8100.

4. Blue Light Absorption Rate and Light Conversion Efficiency (CE) of Composite

An integral hemisphere is used to measure a light dose (B) of blue excitation light. Then, a quantum dot polymer composite is put in the integral hemisphere and irradiated by the blue excitation light to measure a green light dose (A) and a blue light dose (B') out from the composite.

A blue light absorption and a light conversion efficiency or rate are calculated according to the following equations.

Blue light absorption rate (%)=((B−B')/B)×100(%)

Light conversion efficiency (%)=(A/(B−B'))×100(%)

Light conversion rate (%,QE)=(A/B)×100(%)

Example 1

1. Synthesis of Quantum Well (QVV) Quantum Dot
Template Synthesis:

Selenium is dispersed in trioctylphosphine (TOP) to obtain a Se/TOP stock solution. In a 300 milliliter (mL) reaction flask containing trioctylamine, an organic ligand including oleic acid is put and then, heated at 120° C. under vacuum. After about 1 hour, an atmosphere in the reactor is converted into inert gas. While the temperature of the reactor is increased up to 300° C., diethylzinc, diphenylphosphine oxide, and the Se/TOP stock solution are injected thereinto. After completing the injection, a reaction is performed for 40 minutes.

When the reaction is complete, acetone is added to the reaction solution, which is rapidly cooled down to room temperature, and a precipitate obtained by centrifuging the mixture is dispersed in toluene to obtain a ZnSe template. The ZnSe template has an average size of about 2.5 nm.

Amounts of the Zn precursor and the Se precursor used herein are 0.9 millimoles (mmol), and 0.45 mmol, respectively.

Formation of Quantum Well Layer:

An organic ligand including oleic acid is placed in a 300 mL reaction flask containing octadecene (ODE) and vacuum-treated at 120° C. The atmosphere in the flask is changed into nitrogen (N₂). While the temperature of the reactor is increased to 300° C., toluene dispersion of the ZnSe template is rapidly put in the reaction flask, and subsequently, indium laurate, dodecane thiol, zinc oleate, and TOP dispersion of tris(trimethylsilyl)phosphine (hereinafter, also referred to as 'TMSP') are injected thereinto. Then, a reaction is performed for 30 minutes to form a quantum well layer on the template.

When the reaction is complete, the reaction solution is rapidly cooled down to room temperature and ethanol is added thereto, and a precipitate is separated by centrifuging and is dispersed in toluene.

A mole ratio among the Zn precursor, the indium precursor, dodecane thiol, and the phosphorus precursor used herein is 1:3:1:1.

For the particle thus prepared, an ICP analysis is made and a thickness of the prepared alloy quantum well layer is about 0.29 nm, and in the quantum well layer, a value of In+Zn:(P+S) is about 1.17:1. Such results suggest a formation of an alloy semiconductor nanocrystal. For the particle thus prepared, a photoluminescent analysis is made to measure a full width at half maximum of a photoluminescent peak.

Formation of Shell Layer:

Zinc acetate and oleic acid are placed in a 300 mL reaction flask containing TOA and then, vacuum-treated at 120° C. The flask is internally substituted with nitrogen (N₂). While the reaction temperature of the reactor is increased to 320° C., toluene dispersion of the particles having the quantum well layer injected to the reaction flask, then the Se/TOP stock solution are injected thereto, and subsequently, a S/TOP stock solution together with zinc acetate is injected thereto, as well. A reaction is performed for predetermined time, and a ZnSe/ZnS shell layer is formed on the quantum well layer.

An amount, e.g., mole, ratio between a Zn precursor and an Se precursor is about 1:2 and an amount, e.g., mole, ratio of the Zn precursor used for the synthesis of the template: the Zn precursor used for the formation of the shell is about 1:3.

When the reaction is complete, ethanol is added to the reaction solution, which is rapidly cooled down to room temperature, and a precipitate obtained by centrifuging the mixture is dispersed in toluene to obtain toluene dispersion of QW quantum dots. The obtained QW quantum dots have an average size of about 6.5 nm.

Figure 6:
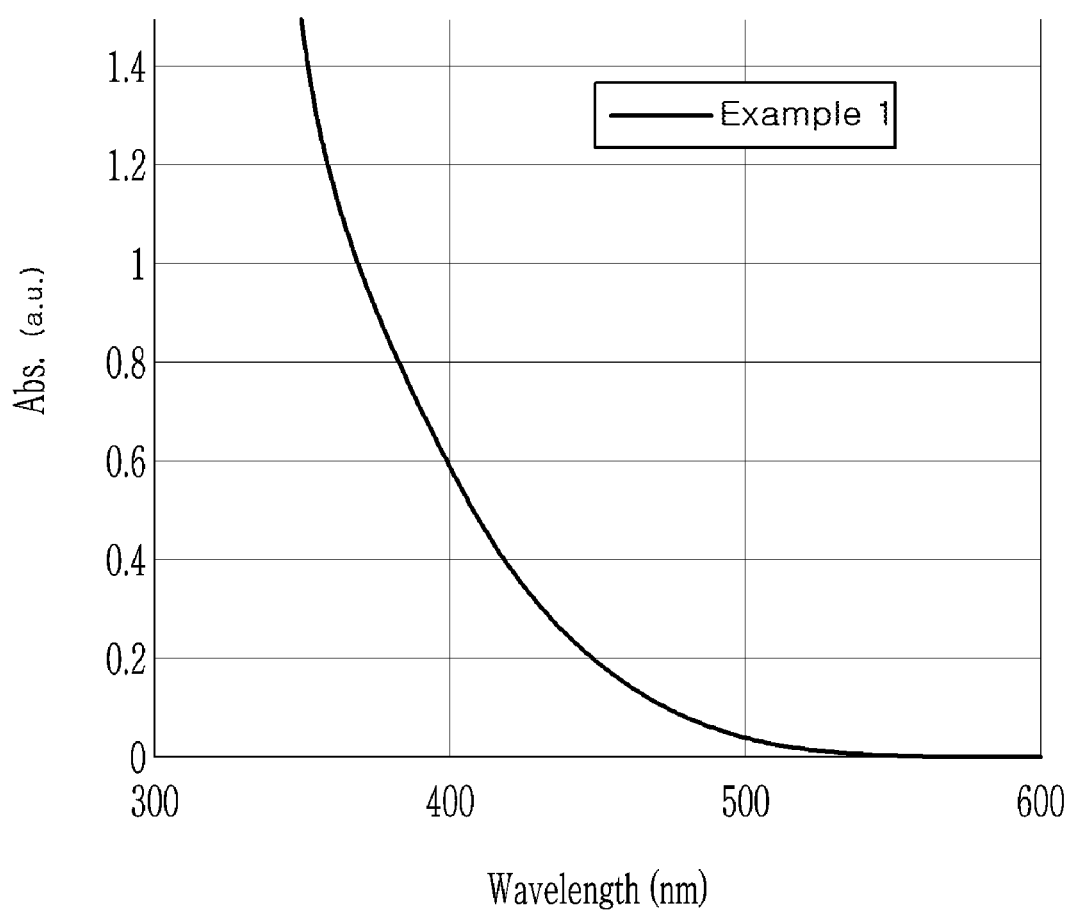
FIG. 6 is a graph of Absorbance (arbitrary units (a.u.)) versus Wavelength (nm) showing the result of UV-Vis spectroscopy of the quantum dots prepared in Example 1.

An UV-Vis absorption spectroscopy analysis is performed for the prepared QW quantum dots, and the results are shown in FIG. 6. The results of FIG. 6 show that the UV-Vis absorption spectrum curve has neither an inflection point nor a first absorption peak.

2. Production of a Quantum Dot Polymer Composite and a Pattern Thereof (1) Preparation of Quantum Dot-Binder Dispersion A chloroform solution of the prepared quantum dots is mixed with a solution of a binder polymer, which is a four membered copolymer of methacrylic acid, benzyl methacrylate, hydroxyethyl methacrylate, and styrene, (acid value: 130 milligrams (mg) of KOH per gram (mg KOH/g), molecular weight: 8,000 grams per mole (g/mol), methacrylic acid:benzyl methacrylate:hydroxyethyl methacrylate:styrene (mole ratio)=61.5:12:16.3:10.2) (solvent: propylene glycol monomethyl ether acetate, PGMEA, a concentration of 30 percent by weight (wt %)) to form a quantum dot-binder dispersion.

(2) Preparation of a Photosensitive Composition

To the prepared quantum dot-binder dispersion, a hexaacrylate having the following structure (as a photopolymerizable monomer), ethylene glycol di-3-mercaptopropionate (hereinafter, 2T, as a multi-thiol compound), an oxime ester compound (as an initiator), TiO₂ as a metal oxide fine particle, and PGMEA (as a solvent) are added to obtain a composition.

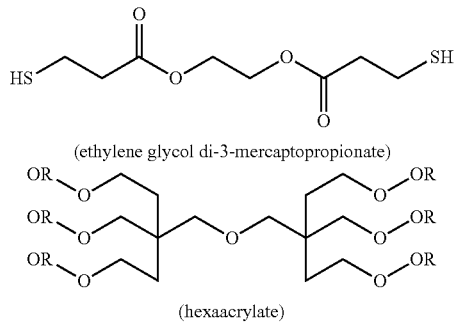

wherein

OR = 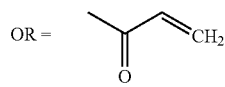

Based on a total solid content, the prepared composition includes 40 wt % of quantum dots, 12.5 wt % of the binder polymer, 25 wt % of 2T, 12 wt % of the photopolymerizable monomer, 0.5 wt % of the photoinitiator, and 10 wt % of the metal oxide fine particle. The total solid content is about 25 wt %.

(3) Formation of Quantum Dot-Polymer Composite Pattern and Heat Treatment Thereof The obtained composition is spin-coated on a glass substrate at 150 revolutions per minute (rpm) for 5 seconds to provide a film. The obtained film is pre-baked at 100° C. (PRB). The pre-baked film is exposed to light (wavelength: 365 nanometers (nm), intensity: 100 millijoules (mJ)) under a mask having a predetermined pattern (e.g., a square dot or stripe pattern) for 1 second (EXP) and developed with a potassium hydroxide aqueous solution (concentration: 0.043 wt %) for 50 seconds to obtain a pattern of a quantum dot polymer composite.

The obtained pattern is heat-treated at a temperature of 180° C. for 30 minutes under a nitrogen atmosphere (FOB).

For the obtained pattern film, a blue light absorption rate and a photoconversion efficiency are measured and the results are shown in Table 1.

Comparative Example 1

1. Synthesis of QW Quantum Dot

A template is prepared in the same manner as in Example 1. A quantum well layer is formed in the same manner as in Example 1 except for not using a zinc precursor and a sulfur precursor.

For the prepared particles, a photoluminescence spectrum analysis is made and the results are shown in Table 1. For the particle thus prepared, an ICP analysis is made and a thickness of the prepared alloy quantum well layer is about 0.22 nm. For the particle thus prepared, a photoluminescent analysis is made to measure a full width at half maximum of a photoluminescent peak, and the results confirm that the FWHM of the QW quantum dot of Comparative Example 1 is two times wider than that of the QW quantum dot of Example 1.

A shell layer is formed in the same manner as set forth in Example 1 except for using the obtained particle having the QW layer. When the reaction is complete, ethanol is added to the reaction solution, which is rapidly cooled down to room temperature, and a precipitate obtained by centrifuging the mixture is dispersed in toluene to obtain toluene dispersion of QW quantum dots. The obtained QW quantum dots have an average size of about 6.5 nm.

An UV-Vis absorption spectroscopy analysis is performed for the prepared QW quantum dots, and the results confirm that the UV-Vis absorption spectrum curve of the QW quantum dot of Comparative Example has an inflection point and a first absorption peak.

2. A quantum dot polymer composite pattern is prepared in the same manner as in Example 1 except for using the prepared QW quantum dot. For the obtained pattern film, a blue light absorption and a photoconversion efficiency are measured and the results are shown in Table 1.

TABLE 1

| | Excitation light absorption rate | A relative light conversion rate of the film after POB (%) |
|---|---|---|
| Comparative Example 1 (InP well) | 82% | 100% |
| Example 1 (InPZnS alloy well) | 93% | 120% |

The QW quantum dots of Example 1 have a narrower FWHM than those of Comparative Example 1, and the results of Table 1 show that the QW quantum dots of Example 1 have improved absorption and enhanced luminance efficiency.

Example 2

1. Synthesis of QW Quantum Dot

A template is prepared in the same manner as in Example 1. A quantum well layer is formed in the same manner as in Example 1 except that amounts of a zinc precursor and a sulfur precursor are adjusted so that a mole ratio of In:Zn:P:S is about 1:1:1:1.

For the particle thus prepared, an ICP analysis is made and a thickness of the prepared alloy quantum well layer is about 0.29 nm, and in the well layer, a value of In+Zn:(P+S) is about 1.4:1. Such results suggest a formation of an alloy semiconductor nanocrystal.

A shell layer is formed on the prepared QW layer in the same manner as set forth in Example 1. When the reaction is complete, ethanol is added to the reaction solution, which is rapidly cooled down to room temperature, and a precipitate obtained by centrifuging the mixture is dispersed in toluene to obtain toluene dispersion of QW quantum dots. The obtained QW quantum dots have an average size of about 6.5 nm.

2. A quantum dot polymer composite pattern is prepared in the same manner as in Example 1 except for using the prepared QW quantum dot. For the obtained pattern film, a blue light absorption and a photoconversion efficiency are measured and the results are shown in Table 2.

Comparative Example 2

1. Synthesis of QW Quantum Dot

A template is prepared in the same manner as in Example 1. A quantum well layer is formed in the same manner as in Example 1 except that the sulfur precursor is not used and a mole ratio of In:Zn:P:S is about 1:1:1.

For the particle thus prepared, an ICP analysis is made and a thickness of the prepared alloy quantum well layer is about 0.22 nm.

A shell layer is formed on the prepared QW layer in the same manner as set forth in Example 1. When the reaction is complete, ethanol is added to the reaction solution, which is rapidly cooled down to room temperature, and a precipitate obtained by centrifuging the mixture is dispersed in toluene to obtain toluene dispersion of QW quantum dots. The obtained QW quantum dots have an average size of about 6.5 nm.

2. A quantum dot polymer composite pattern is prepared in the same manner as in Example 1 except for using the prepared QW quantum dot. For the obtained pattern film, a blue light absorption and a photoconversion efficiency are measured and the results are shown in Table 2.

TABLE 2

| | Excitation light absorption rate | A relative light conversion rate of the film after POB (%) |
|---|---|---|
| Comparative Example 2 | 82% | 80% |
| Example 2 (InPZnS alloy well) | 95% | about 130% |

The results of Table 2 show that the QW quantum dots of Example 2 have improved absorption and enhanced luminance efficiency in comparison with the QW quantum dots of Comparative Example 2.

While this disclosure has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

What is claimed is:

1. A quantum dot comprising
a template comprising a first semiconductor nanocrystal,
a quantum well layer disposed on the template, and
a shell disposed on the quantum well layer, the shell comprising a second semiconductor nanocrystal,
wherein the quantum dot does not comprise cadmium,
wherein the first semiconductor nanocrystal comprises a first zinc chalcogenide,
wherein the second semiconductor nanocrystal comprises a second zinc chalcogenide,
wherein the quantum well layer comprises an alloy semiconductor nanocrystal comprising indium, phosphorus, zinc, and a chalcogen element, and
wherein a bandgap energy of the alloy semiconductor nanocrystal is less than a bandgap energy of the first semiconductor nanocrystal and less than a bandgap energy of the second semiconductor nanocrystal.

2. The quantum dot of claim 1, wherein
the first zinc chalcogenide comprises ZnSe, ZnTeSe, ZnSeS, ZnS, or a combination thereof, and
the second zinc chalcogenide independently comprises ZnSe, ZnTeSe, ZnSeS, ZnS, or a combination thereof.

3. The quantum dot of claim 1, wherein the first semiconductor nanocrystal and the second semiconductor nanocrystal have different compositions from one another.

4. The quantum dot of claim 1, wherein
the first semiconductor nanocrystal comprises ZnSe, ZnTeSe, ZnSeS, ZnS, or a combination thereof, and
the second semiconductor nanocrystal comprises ZnSe, ZnSeS, ZnS, or a combination thereof.

5. The quantum dot of claim 1, wherein the chalcogen element comprises sulfur.

6. The quantum dot of claim 1, wherein a difference between a lattice constant of the alloy semiconductor nanocrystal and the first semiconductor nanocrystal is less than or equal to about 3%, and
wherein a difference between a lattice constant of the alloy semiconductor nanocrystal and the second semiconductor nanocrystal is less than or equal to about 3%.

7. The quantum dot of claim 1, wherein the quantum dot has a total molar amount of indium and phosphorus of less than or equal to about 20%, based on a total number of moles of elements in the quantum dot.

8. The quantum dot of claim 1, wherein in the quantum dot, a mole ratio of phosphorus with respect to indium is greater than or equal to about 0.5:1 and less than or equal to about 0.9:1.

9. The quantum dot of claim 1, wherein in the quantum dot, a mole ratio of zinc with respect to indium is greater than or equal to about 15:1 and less than or equal to about 55:1.

10. The quantum dot of claim 1, wherein in the quantum dot, a mole ratio of a sum of sulfur and selenium with respect to zinc is greater than or equal to about 0.5:1 and less than or equal to about 1:1.

11. The quantum dot of claim 1, wherein in the quantum dot, a mole ratio of sulfur with respect to selenium is greater than or equal to about 0.3:1 and less than or equal to about 0.9:1.

12. The quantum dot of claim 1, wherein the shell comprises
a first layer comprising a third zinc chalcogenide, and
a second layer comprising a fourth zinc chalcogenide having a different composition from the third zinc chalcogenide.

13. The quantum dot of claim 12, wherein
the first layer comprises ZnSe, ZnSeS, or a combination thereof, and
the second layer comprises ZnS.

14. The quantum dot of claim 12, wherein
the first layer is directly on the quantum well layer, and
the second layer is an outermost layer of the shell.

15. The quantum dot of claim 1, wherein a thickness of the quantum well layer is greater than or equal to about 0.1 nanometers and less than or equal to about 0.35 nanometers.

16. The quantum dot of claim 1, wherein a size of the quantum dot is greater than or equal to about 3 nanometers and less than or equal to about 7 nanometers.

17. The quantum dot of claim 1, wherein the quantum dot comprises an organic ligand on a surface thereof, and the organic ligand comprises RCOOH, RCOOCOR, $RNH_2$, $R_2NH$, $R_3N$, RSH, $R_3PO$, $R_3P$, ROH, RCOOR', $RPO(OH)_2$, $R_2POOH$, or a combination thereof, wherein R and R' are independently a substituted or unsubstituted C1 to C30 aliphatic hydrocarbon, a substituted or unsubstituted C6 to C30 aromatic hydrocarbon, or a combination thereof.

18. The quantum dot of claim 1, wherein
the quantum dot emits green light, and
an ultraviolet-visible absorption spectrum curve of the quantum dot does not have an inflection point within a wavelength range of about 450 nanometers to about 620 nanometers.

19. The quantum dot of claim 1, wherein the quantum dot exhibits a maximum luminescent peak wavelength in a range of about 500 nanometers to about 540 nanometers.

20. The quantum dot of claim 1, wherein a quantum efficiency of the quantum dot is greater than or equal to about 40%.

21. A quantum dot polymer composite comprising
a polymer matrix; and
a plurality of quantum dots of claim 1 dispersed in the polymer matrix.

22. The quantum dot-polymer composite of claim 21, wherein the polymer matrix comprises a linear polymer, a crosslinked polymer, or a combination thereof.

23. The quantum dot-polymer composite of claim 21, wherein the polymer matrix further comprises a polymerization product of a monomer combination comprising a thiol compound and an ene compound having a carbon-carbon unsaturated bond, a metal oxide particulate, or a combination thereof.

24. The quantum dot-polymer composite of claim 21, wherein the quantum dot polymer composite is in a form of a patterned film.

25. The quantum dot-polymer composite of claim 21, wherein the quantum dot polymer composite exhibits an absorption of greater than or equal to about 90% for blue light or a blue light conversion efficiency of greater than or equal to about 15% after the quantum dot polymer composite is thermally treated at a temperature of about 180° C. for 30 minutes.

26. A display device, comprising
a light emitting element,
wherein the light emitting element comprises the quantum dot-polymer composite of claim 21.

27. The display device of claim 26, further comprising a light source, wherein the light source is configured to provide the light emitting element with incident light, and wherein the incident light comprises a light having a peak wavelength of about 440 nanometers to about 460 nanometers.

28. The display device of claim 26, wherein the light emitting element comprises a sheet of the quantum dot polymer composite.

29. The display device of claim 26, wherein the light emitting element comprises a stacked structure comprising
a substrate, and
a light emitting layer disposed on the substrate,
wherein the light emitting layer comprises a pattern comprising the quantum dot-polymer composite, and
wherein the pattern comprises a repeating section emitting light of a predetermined wavelength.

30. The display device of claim 29, wherein the pattern comprises a first repeating section emitting first light and a second repeating section emitting a second light having a different emission peak wavelength from the first light.

* * * * *